(12) United States Patent
Hiraide et al.

(10) Patent No.: US 7,178,078 B2
(45) Date of Patent: Feb. 13, 2007

(54) TESTING APPARATUS AND TESTING METHOD FOR AN INTEGRATED CIRCUIT, AND INTEGRATED CIRCUIT

(75) Inventors: Takahisa Hiraide, Kawasaki (JP);
Hitoshi Yamanaka, Kawasaki (JP);
Junko Kumagai, Kawasaki (JP);
Hideaki Konishi, Kawasaki (JP);
Daisuke Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 323 days.

(21) Appl. No.: 10/000,089

(22) Filed: Dec. 4, 2001

(65) Prior Publication Data
US 2002/0124217 A1 Sep. 5, 2002

(30) Foreign Application Priority Data
Dec. 7, 2000 (JP) .............................. 2000-372231
Jul. 5, 2001 (JP) .............................. 2001-205179

(51) Int. Cl.
*G01R 31/28* (2006.01)
(52) U.S. Cl. .................. 714/739; 714/30; 714/724; 714/732; 714/734
(58) Field of Classification Search .................. None
See application file for complete search history.

(56) References Cited

U.S. PATENT DOCUMENTS 5,612,963 A * 3/1997 Koenemann et al. ....... 714/739
5,991,909 A * 11/1999 Rajski et al. ............... 714/729
6,061,818 A * 5/2000 Touba et al. ................ 714/739

(Continued)

FOREIGN PATENT DOCUMENTS

EP 0 481 097 A11 4/1992

(Continued)

OTHER PUBLICATIONS

Jas et al., "Hybrid BIST Based on Weighted Pseudo-Random Testing: a New Test Resource Partitioning Scheme", IEEE Proceedings, VTS 2001, Apr. 29-May 3, 2001, pp. 2-8.*

(Continued)

*Primary Examiner*—Guy Lamarre
*Assistant Examiner*—John P. Trimmings
(74) *Attorney, Agent, or Firm*—Staas & Halsey LLP

(57) ABSTRACT

An apparatus enables a high quality test to be carried out within a short time, without forcing a severe design limitation on the designer and without an expensive tester. The apparatus includes a pattern generator built in an integrated circuit to generate pseudo random patterns as test patterns. A plurality of shift registers are configured with sequential circuit elements inside said integrated circuit. An automatic test pattern generating unit generates ATPG patterns. A pattern modifier modifies a portion, to which a predetermined value is required to be set in order to detect a fault, in said pseudo random patterns generated by said pattern generator, on a basis of said ATPG patterns, and inputs said modified pseudo random patterns to said shift registers.

26 Claims, 22 Drawing Sheets

U.S. PATENT DOCUMENTS

| | | | |
|---|---|---|---|
| 6,070,252 A * | 5/2000 | Xu et al. ..................... 714/30 |
| 6,070,261 A * | 5/2000 | Tamarapalli et al. ........ 714/733 |
| 6,327,687 B1 * | 12/2001 | Rajski et al. ................ 714/738 |
| 6,557,129 B1 * | 4/2003 | Rajski et al. ................ 714/729 |
| 6,684,358 B1 * | 1/2004 | Rajski et al. ................ 714/739 |
| 6,708,305 B1 * | 3/2004 | Farnsworth et al. ........ 714/739 |
| 6,715,105 B1 * | 3/2004 | Rearick ....................... 714/30 |
| 2002/0093356 A1 * | 7/2002 | Williams et al. ............ 324/765 |

FOREIGN PATENT DOCUMENTS

| | | |
|---|---|---|
| JP | 57-116269 | 7/1982 |
| JP | 61-240173 | 10/1986 |
| JP | 63-83679 | 4/1988 |
| JP | 11-237450 | 8/1999 |
| JP | 2000-329831 | 11/2000 |

OTHER PUBLICATIONS

Barnhart et al., "OPMISR: The Foundation for Compressed ATPG Vectors", IEEE Proceedings TC 2001, Oct. 30-Nov. 1, 2001.*

* cited by examiner

FIG. 5

| SCAN PATH NUMBER | RANDOM NUMBER | | | | | ATPG | | | | |
|---|---|---|---|---|---|---|---|---|---|---|
| 0th(#0)   | 0 | 1 | 0 | 1 | 0 | — | 1 | — | — | — |
| 1st(#1)   | 1 | 0 | 1 | 0 | 1 | 1 | 1 | 1 | 0 | 1 |
| 2nd(#2)   | 0 | 1 | 0 | 1 | 0 | — | — | 0 | — | — |
| 3rd(#3)   | 1 | 0 | 1 | 0 | 1 | — | — | 1 | 1 | — |
| 4th(#4)   | 0 | 1 | 0 | 1 | 0 | — | 0 | — | — | — |
| ⋮ | ⋮ | | | | | ⋮ | | | | |
| 126th(#126) | 1 | 0 | 1 | 0 | 1 | — | 0 | — | 0 | — |
| 127th(#127) | 0 | 1 | 0 | 1 | 0 | — | 0 | — | 1 | — |

X01XX1XXX(DP2) ⟶ 001011101(m=1)
001010101(RP2)

0XXX1X1X0(DP3) ⟶ 010110110(m=2)
110110111(RP3)

0XXX1X1X0(DP3) ⟶ 011010110(m=0)
011010110(RP1)

X01XX1XXX(DP2) ⟶ 001011101(m=1)
001010101(RP2)

FIG. 11

| ATPG PATTERN | PSEUDO RANDOM PATTERN | MODIFIED TEST PATTERN |
|---|---|---|
| 1X000X11X(DP1) → | 011010110(RP1) → | 110000110(m=3) |
| X01XX1XXX(DP2) → | 001010101(RP2) → | 001011101(m=1) |
| 0XXX1X1X0(DP3) → | 110110111(RP3) → | 010110110(m=2) |
| 01XXX0XXX(DP4) → | 100101011(RP4) → | 010100011(m=3) |
| 1XXXX1110(DP5) → | 000011101(RP5) → | 100011110(m=3) |
| 10XXXXXXX(DP6) → | 100110011(RP6) → | 100110011(m=0) |

FIG. 12

| ATPG PATTERN | PSEUDO RANDOM PATTERN | MODIFIED TEST PATTERN |
|---|---|---|
| 1X000X11X(DP1) | 011010110(RP1) → | 011010110(m=0) |
| X01XX1XXX(DP2) | 001010101(RP2) → | 001011101(m=1) |
| 0XXX1X1X0(DP3) | 110110111(RP3) → | 110000111(m=2) |
| 01XXX0XXX(DP4) | 100101011(RP4) → | 100101110(m=2) |
| 1XXXX1110(DP5) | 000011101(RP5) → | 010010101(m=2) |
| 10XXXXXXX(DP6) → | 100110011(RP6) → | 100110011(m=0) |

TESTING APPARATUS AND TESTING METHOD FOR AN INTEGRATED CIRCUIT, AND INTEGRATED CIRCUIT

BACKGROUND OF THE INVENTION

1. Field of the Invention

The present invention relates to a testing apparatus and a testing method for detecting manufacturing failure of an integrated circuit such as an LSI (Large Scale Integration) or the like, and relates to an integrated circuit having the testing apparatus.

2. Description of the Related art

Detection of manufacturing failure of, for example, an LSI is performed by applying an appropriate signal value to an input pin of the LSI using a tester, and comparing a signal value appearing at an output pin with an expected result. The signal value applied to the input pin and the expected value that should appear at the output pin are collectively called a test pattern, in general.

Defect occurring in an LSI due to manufacturing failure of the LSI is called fault. In order to verify all faults that may occur inside the LSI, a lot of test patterns are necessary. A ratio of the number of faults that can be verified with a certain pattern to the number of all faults estimated inside the LSI is called a detection ratio (or fault coverage), used as a scale when quality of the test pattern is considered. When the LSI contains a sequential circuit element [flip-flop (F/F), latch, or RAM], complexity of creation of the test pattern remarkably increases.

For this, scan design is generally made for LSIs. In an LSI applied the scan design, a shift register (called a Scan Path) is configured with sequential circuit elements (mainly F/Fs) inside the LSI, a desired value is shifted-in the shift registers at the time of test, and a value of the shift register is read out after a clock is applied.

In such a circuit, Deterministic Stored Pattern Test (hereinafter referred as DSPT) is widely employed. DSPT is performed by storing a test pattern created by Automatic Test Pattern Generator (hereinafter referred as ATPG) in a tester (ATE; Automatic Test Equipment).

FIG. 21 is a diagram for illustrating a known scan design. In FIG. 21, concept of the scan design is shown as a block diagram. As shown in FIG. 21, a plurality of scan paths (shift registers) #0, #1, . . . , and #n−1 that are routes for testing an LSI are formed in an LSI applied the scan design. Each of the scan paths #i (i=0, 1, . . . , and n−1) is configured with a plurality of F/Fs that are storage elements. A test pattern is shifted-in from one end (left side in FIG. 21) of each of the scan paths #i, and a result of the test is outputted from the other end (right side in FIG. 21).

With increase of integration of LSIs, the number of sequential circuit elements contained inside is increased. For this, when setting and reading of all sequential circuit elements configuring scan paths are repeated for each test pattern, not only the testing time is increased, but also a memory capacity of the tester becomes insufficient due to an increase of test data.

In generating a test pattern by an ATPG, a compressing method called dynamic compaction is generally used in order to decrease a quantity of test data.

The dynamic compaction is a compressing process for test data as follows: Namely, when a test for primary fault on a target is successful with a test pattern generated by an ATPG, one secondary fault is selected in a set of remaining undetected faults under net state conditions set in order to detect the primary fault, and a new value is set to a net that is still an indeterminate value to execute generation of a test pattern for the above secondary fault. A process similar to the above is repeated until another secondary fault is not selected from the set of undetected faults. When another secondary fault is selected, the same fault is not again selected. The dynamic compaction is to decrease test data by increasing the number of faults detected in units of test as above.

Even when test data is compressed in the dynamic compaction, the increase of sequential circuit elements with increase of integration of a recent LSI is extremely great. Therefore, it is difficult to solve the problems of increase of the testing time and shortage of the memory capacity of a tester.

In order to solve the above problems, Built In Self Test (hereinafter referred as BIST) is performed recently. In BIST, a pattern generated by a pseudo random pattern generator is applied to an internal circuit of an LSI, and an outputted result from the internal circuit is verified and stored by an output verifier. As the pseudo random pattern generator and the output verifier, there is used a linear feedback shift register (hereinafter referred as LFSR) is used in many cases. Particularly, the output verifier is called a multiple input signature register (hereinafter referred as MISR) since it compresses and stores outputted results as signature.

FIG. 22 is a diagram for illustrating a known BIST circuit. In FIG. 22, a concept of the BIST circuit is shown as a block diagram. As shown in FIG. 22, an LFSR 2, a phase shifter 3, a space compactor 6 and an MISR 7 along with the above scan paths #0, #1, . . . , and #n−1 are build in an LSI having the BIST circuit.

A pseudo random pattern generated by the LFSR 2 is inputted to the lead F/F of each scan path #i through the phase shifter 3. Each of outputted results from the scan path #i is compressed into about the number of bits (for example, 32 bits) of the MISR 7 by the space compactor 6, then the results are further compressed and stored by the MISR 7.

Since the LFSR (pseudo random pattern generator) 2 is mounted inside the LSI in BIST, an enormous number of test patterns can be generated within a short time, as above. The MISR 7 compresses and stores results of the test, so that a quantity of data to be loaded in the tester can be greatly decreased.

In the test on LSIs, either DSPT based on the scan design or BIST where a test circuit is built in is used now.

DSPT enables a test of a very high quality (detection ratio) since it uses test patterns created by an ATPG, thus can readily add test patterns. However, the number of test patterns is largely increased for a large scale LSI, it thus becomes difficult to store all test patterns created by the ATPG on the memory of a tester, and the testing time by the tester is increased. Therefore, a very expensive tester is required to carry out DSPT.

BIST can solve the problems of the above DSPT, but has some problems. Since pseudo random patterns are used in BIST, a quality of the test is in question. In order to increase the fault coverage, it is necessary to apply DSPT as an additional test, or insert such a test point in the internal circuit as to increase controllability and observability. MISR is used to compress data in BIST. However, even once an indeterminate state is captured, all registers in the MISR are brought into the indeterminate state, and the test cannot be carried out.

Since sequential circuit elements including a RAM inside an LSI are generally in the indeterminate state when the power source is turned on, it is necessary to beforehand apply a pattern to initialize these sequential circuit elements, or to such invent the circuit as to prevent the indeterminate state from propagating to the MISR. Other than this, the designer is forced such limitations in design too severe to apply BIST to an actual circuit that a conflict or a float state caused by the random pattern has to be prevented in design of bus and the like. Additionally, inserting the BIST circuit and a test point causes area overhead of the circuit.

SUMMARY OF THE INVENTION

In the light of the above problems, an object of the present invention is to overcome problems of DSPT and BIST as above, and to execute a high quality test within a short time by using advantages of these two tests. Another object of this invention is to execute a high quality test without forcing a severe design limitation on the designer at this time, and without an expensive tester.

In order to accomplish the above objects, the present invention provides a testing apparatus for an integrated circuit comprising a pattern generator built in the integrated circuit to generate test patterns, a plurality of shift registers configured with sequential circuit elements inside the integrated circuit, and a pattern modifier for modifying the test patterns generated by the pattern generator according to an external input, and inputting the modified test patterns to the shift registers.

The present invention further provides a testing apparatus for an integrated circuit comprising a plurality of shift registers, to which test patterns are inputted, configured with sequential circuit elements inside the integrated circuit, a mask for masking an indeterminate value in outputs from the shift registers, and an output verifier for verifying output results masked by the mask.

The present invention still further provides a testing apparatus for an integrated circuit comprising a pattern generator built in the integrated circuit to generate test patterns, a plurality of shift registers configured with sequential circuit elements inside the integrated circuit, a pattern modifier for modifying the test patterns generated by the pattern generator according to an external input, and inputting the modified test patterns to the plural shift registers, a mask for masking an indeterminate value in outputs from the shift registers, and an output verifier for verifying output results masked by the mask.

The present invention also provides a testing method for an integrated circuit comprising the steps of generating test patterns by a pattern generator built in the integrated circuit, modifying the generated test patterns according to an external input, and inputting the modified test patterns to a plurality of shift registers configured with sequential circuit elements inside the integrated circuit.

The present invention also provides an integrated circuit including sequential circuit elements, having the above testing apparatus.

The testing apparatus and testing method for an integrated circuit, and the integrated circuit according to this invention provide the following effects and advantages:

(1) Since test patterns generated by the pattern generator built in the integrated circuit are modified by the pattern modifier, and inputted to the shift registers, the number of scan paths that are the shift registers is increased, thus the number of stages of the scan path can be decreased. This allows the testing time of the integrated circuit to be largely shortened. It is also possible to solve problems of DSPT and BIST, and create test patterns enabling a high quality test having advantages of the both to be carried out within a short time. At this time, only significant data (information on F/Fs which need to be set values) is supplied from a tester (external input) and modified, so that a quantity of data to be stored in the tester is largely decreased. Accordingly, it is possible to carry out a high quality test without forcing a severe design limitation on the designer, and without an expensive tester.

(2) Since an indeterminate value in outputs from the plural shift registers configured with sequential circuit elements inside the integrated circuit is masked, and the masked output result is verified by the output verifier, the indeterminate state does not spoil compressed results even when the output results from the sequential circuit elements are compressed and read out to the outside.

BRIEF DESCRIPTION OF THE DRAWINGS

FIG. 5 is a diagram for illustrating setting of random numbers (pseudo random patterns) and ATPG according to the first embodiment of this invention;

FIGS. 9 through 12 are diagrams for illustrating practical examples of a pattern modifying operation according to the second embodiment of this invention;

DESCRIPTION OF THE PREFERRED EMBODIMENTS

[1] Description of Aspect of the Invention

Figure 1:
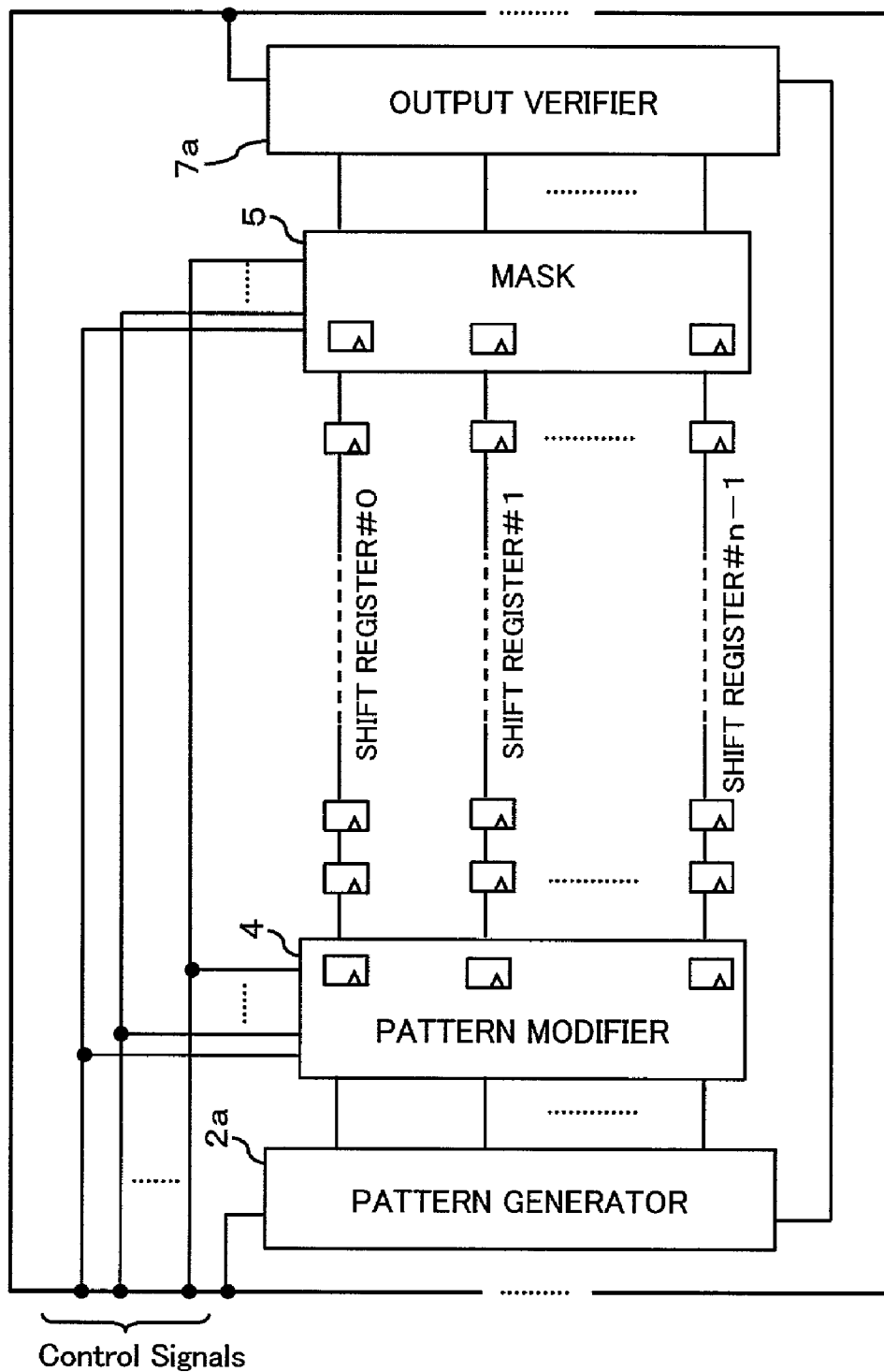
FIG. 1 is a block diagram for illustrating an aspect of this invention.

FIG. 1 is a block diagram for illustrating an aspect of this invention. In FIG. 1, reference character 2a denotes a pattern generator, 4 a pattern modifier, 5 a mask, 7a an output verifier, and #0 to #n−1 shift registers (scan paths).

To accomplish the above objects, the present invention is configured as follows.

[1-1] A testing apparatus for an integrated circuit comprises a pattern generator 2a built in the integrated circuit to generate test patterns, a plurality of shift registers #0 to #n−1 configured with sequential circuit elements inside the integrated circuit, and a pattern modifier 4 for modifying the test patterns generated by the pattern generator 2a according to an external input, then inputting them to the shift registers #0 to #n−1. Whereby, the number of scan paths that are the shift registers #0 to #n−1 is increased to decrease the number of stages of the scan paths, which allows a testing time for the integrated circuit (LSI or the like) to be shortened. At this time, only significant data (information on F/Fs which require setting or the like) is supplied from a tester (external input) and modified, so that a quantity of data to be stored in the tester can be decreased.

[1-2] A testing apparatus for an integrated circuit according to this invention comprises a plurality of shift registers #0 to #n−1 configured with sequential circuit elements inside the integrated circuit, to which a test pattern is inputted, a mask 5 masking an indeterminate value in outputs from the shift registers #0 to #n−1 to convert the indeterminate state to a specified state, and an output verifier 7a verifying an output result masked by the mask 5. Even when results of the sequential circuit elements (internal F/Fs) are compressed and read out to the outside, a result of the compression is not spoiled by the indeterminate state (X state).

[1-3] A testing apparatus for an integrated circuit according to this invention comprises the pattern generator 2a, a plurality of the shift registers #0 to #n−1, the pattern modifier 4, the mask 5 and the output verifier 7a, thereby increasing the number of scan paths to shorten the test time for an integrated circuit (LSI or the like). Only significant data is supplied from a tester (external input) and modified, so that data to be stored in the tester can be decreased, and the indeterminate state does not spoil a result of compression even when results of the internal F/Fs are compressed and read out to the outside.

[1-4] The testing apparatus described in the above [1-2] or [1-3], the output verifier 7a may include a compressing means compressing the masked output result, thereby efficiently storing results of the internal F/Fs in the output verifier 7a.

[1-5] The testing apparatus described in the above [1-1] or [1-3] may further comprise an automatic test pattern generating unit (not shown in FIG. 1) generating ATPG patterns and giving them as the external input to the pattern modifier 4. Wherein, the pattern generator 2a may generate pseudo random patterns as the test pattern, while the pattern modifier 4 may modify the pseudo random patterns on the basis of the ATPG patterns given from the automatic test pattern generating unit. It is thereby possible to solve problems of DSPT and BIST, and generate test patterns having advantages of the both, and enabling a high quality test to be carried out within a short time.

[1-6] In the testing apparatus described in the above [1-5], the pattern modifier 4 may select a suitable combination of one pseudo random pattern and one ATPG pattern from the pseudo random patterns generated by the pattern generator 2a and the ATPG patterns as the external input, and modify the selected pseudo random pattern on the basis of the selected ATPG pattern. It is thereby possible to decrease a quantity of pattern modification by the pattern modifier 4 and efficiently modify the pattern.

[1-7] In the testing apparatus described in the above [1-5], the automatic test pattern generating unit may refer to each of the pseudo random patterns generated by the pattern generator 2a, select a suitable target fault according to each of the pseudo random patterns, and generate an ATPG pattern, with which the target fault can be detected, as a reference for modifying each of the pseudo random patterns. It is thereby possible to decrease a quantity of pattern modification by the pattern modifier 4, and efficiently modify the pattern.

[1-8] The testing apparatus described in the above [1-5] may further comprise a characteristic information determining unit (not shown in FIG. 1) comparing the pseudo random patterns generated by the pattern generator 2a with the ATPG patterns as the external input, and determining characteristic information on the pattern generator 2a with which the pattern generator 2a can generate pseudo random patterns analogous to the ATPG patterns. The pattern generator 2a may generate the pseudo random patterns on the basis of the characteristic information determined by the characteristic information determining unit. It is thereby possible to decrease a quantity of pattern modification by the pattern modifier 4 to efficiently modify the pattern.

[1-9] The testing apparatus described in the above [1-5] may further comprise an execution limitation condition setting unit (not shown in FIG. 1) for setting, when the automatic test pattern generating unit executes a compressing process on the ATPG patterns, an execution limitation condition for limiting the execution of the compressing process. When the execution limitation condition set by the execution limitation condition setting unit is satisfied, the automatic test pattern generating unit terminates the compressing process on the ATPG patterns. It is thereby possible to suppress the number of request values (values other than indeterminate value) in the ATPG pattern to decrease a quantity of pattern modification by the pattern modifier 4, which leads to efficient pattern modification.

[2] Outline of Embodiments of the Invention

Hereinafter, description will be made of embodiments of this invention with reference to the drawings.

In order to make a higher quality test on an integrated circuit such as an LSI or the like, a method using a pseudo random pattern has a limitation like BIST. Namely, since a fault that is difficult to be found by the random pattern exists, it is necessary to insert a test point to improve controllability and observability of the circuit, and generate a great number of random patterns. Nevertheless, it is impossible to realize the same quality as that of the deterministic pattern generated by an ATPG.

On the other hand, when a pattern is generated by the ATPG, a fault at one point in the internal circuit is basically supposed, and a pattern for detecting it is created. A pattern such created will be referred as an ATPG pattern. The ATPG pattern is configured with set values of all internal F/Fs, and state values of all F/Fs having been applied a system clock.

Figure 2:
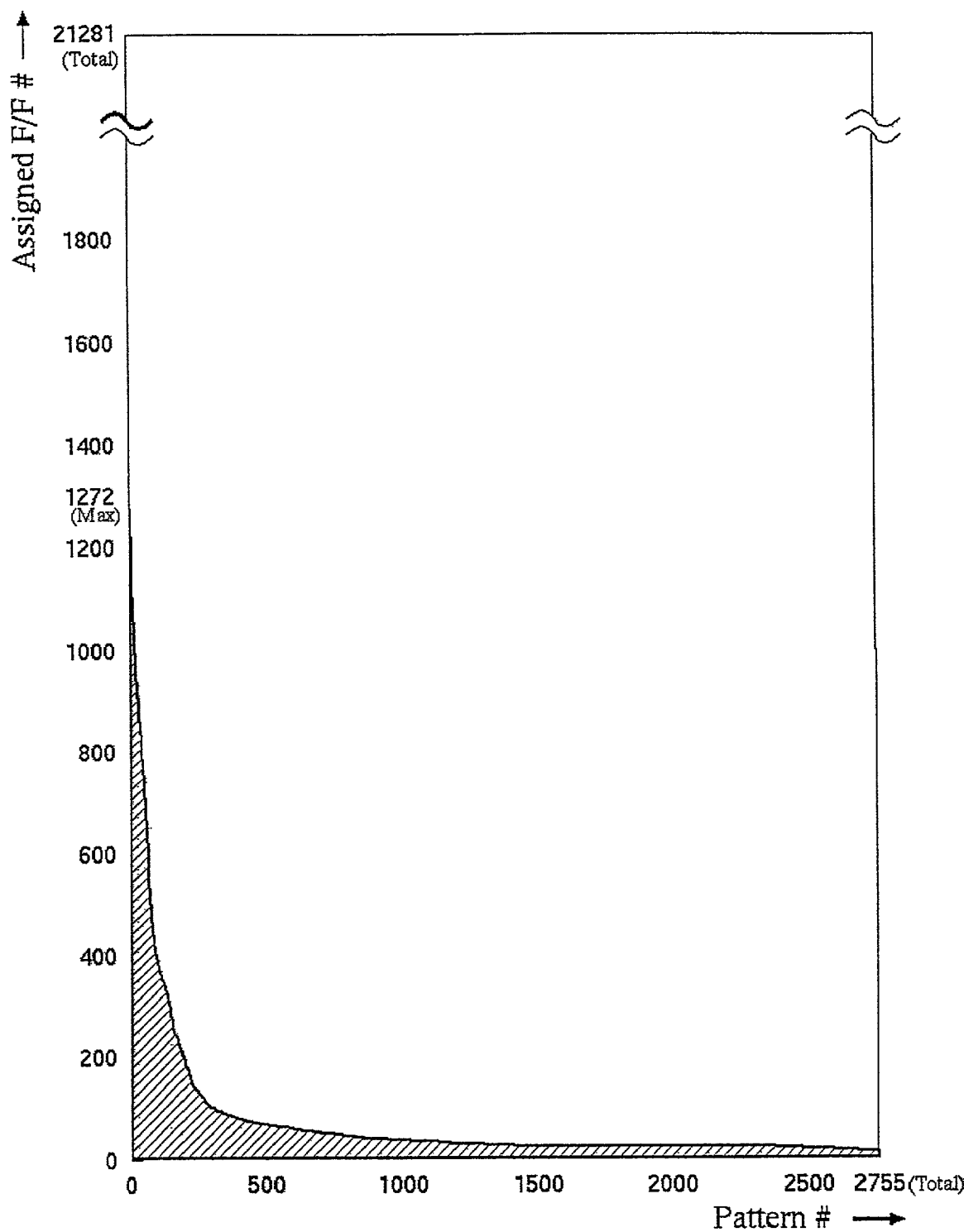
FIG. 2 is a diagram for illustrating a state of distribution of the number of set F/Fs in ATPG according to an embodiment.

FIG. 2 is a diagram for illustrating a state of distribution of the number of set F/Fs of the ATPG. In FIG. 2, the horizontal axis represents the number of ATPG patterns (Pattern #) for detecting faults of the internal circuit, while the vertical axis represents the number (Assigned F/F #) of F/Fs (set F/Fs) to which values for detecting the faults should be set. The ATPG basically creates a pattern such as to detect one fault with one pattern. Accordingly, the number of F/Fs to which values are set is far from enough. For this, it is a main stream that patterns are such compressed (dynamic compaction stated above) as to detect a plurality of faults with one ATPG pattern. Data shown in FIG. 2 is a result of compaction of patterns. An ATPG pattern in which the number of set F/Fs is more than a thousand is such created and set as to detect a plurality of faults. Incidentally, the ATPG patterns are sorted in the descending order of the set F/Fs.

In DSPT, it is necessary to supply (the number of ATPG patterns)×(the number of all F/Fs)

of data from a tester to a test target LSI. This corresponds to data in an entire area (21281×2755) of the rectangle shown in FIG. 2. On the other hand, a quantity of significant data set by the ATPG is only a shadowed area in FIG. 2. For instance, in the first ATPG pattern, it is necessary to set data to 1272 F/Fs, while in the thousandth ATPG pattern, it is necessary to set data to about 50 F/Fs. As this, the number of sequential circuit elements (F/Fs) that the ATPG needs to set values in order to detect a relevant fault is extremely small as compared with the number of all the F/Fs (21281).

According to this invention, only significant data set by the ATPG can be supplied from the tester, and a deterministic pattern can be applied to a test target LSI.

In the case of an LSI applied scan design, F/Fs inside the LSI are distributed to a plurality of scan paths that can be shifted in parallel, one ATPG pattern is divided into a plurality of shift patterns to be applied, and inputted from the tester to each of the scan paths, whereby the testing time can be shortened. At this time, the testing time in the LSI applied scan design is (the number of ATPG patterns)×(the number of stages of scan path)×(test cycle).

In this case, the number of stages of the scan path in the above formula is the number of F/Fs in a scan path to which the largest number of F/Fs are distributed. The test cycle is a clock cycle supplied to the LSI by the tester, which depends on performance of the tester.

Since it is possible to operate the internal pattern generator in BIST, the testing time can be shortened by shortening the clock cycle (test cycle). Further, it is possible to readily increase the number of scan paths by increasing the number of output pins of the pattern generator. As a result, it is possible to decreas the number of stages of the scan path to shorten the testing time.

In DSPT, it is necessary to set an input pin and an output pin to each scan path, and connect them to a tester. The number of these input and output pins depends on performance of the tester, so that the number of scan paths cannot be increased more than limitations of the tester.

According to this invention, the number of the scan paths is increased to decrease the number of stages of the scan path like BIST, thereby shortening the testing time of an LSI. At this time, data given from the tester is invented (for example, chain information being compressed by a decoder circuit or the like), and only significant data (information on F/Fs to which values need to be set) is supplied from the tester using a small number of pins within the limitations of the tester.

According to this invention, increase of the testing time and increase of a memory capacity of the tester, which are problems of DSPT, are solved by BIST, while a method of interpolating a pseudo random pattern with an ATPG pattern and using them is employed as a method of improving the fault coverage, which is a problem of BIST.

Although the number of F/Fs to which values should be set by the ATPG is small, a random pattern is set to the remaining F/Fs when the pattern is actually supplied from the tester. Reason of this is that it is expected that a fault other than the relevant fault is incidentally verified with the pattern. According to this invention, a circuit similar to BIST is used to supply a random pattern to most of the F/Fs other than the F/Fs to which setting information is supplied from the tester for the above purpose, as well.

In the LSI test, it is necessary that values are set to the internal F/Fs through a scan path from the tester, a clock of the system is applied, after that, the value of the internal F/Fs is read out through the scan path and compared with an expected value. When the internal F/Fs are required to operate at a high speed or the number of scan paths is large, BIST employs a method of compressing results of the internal F/Fs and storing them, and afterwards reading them by the tester and comparing them with expected values, not hastily. For this, there is used an MISR configured with an LFSR and an EOR (exclusive OR) gate.

According to this invention, it is necessary to compress values of the internal F/Fs and read them out like BIST in order to increase the number of scan paths. At this time, there is a case where the indeterminate state (X state) of a RAM or the like spoils a result of the compaction in the MISR as described in the problems of BIST. An EOR gate is used at an entrance of the MISR, and an EOR gate is also used in a feedback loop of the MISR. If there is the indeterminate state of even one input to the EOR gate, an output of the EOR gate is brought into the indeterminate state. For this, all registers in the MISR in which an EOR gate is interposed in the feedback loop thereof are degenerated into the indeterminate state. According to this invention, an output in the indeterminate state is masked on the output's side of the scan path.

[3] Description of First Embodiment

Figure 3:
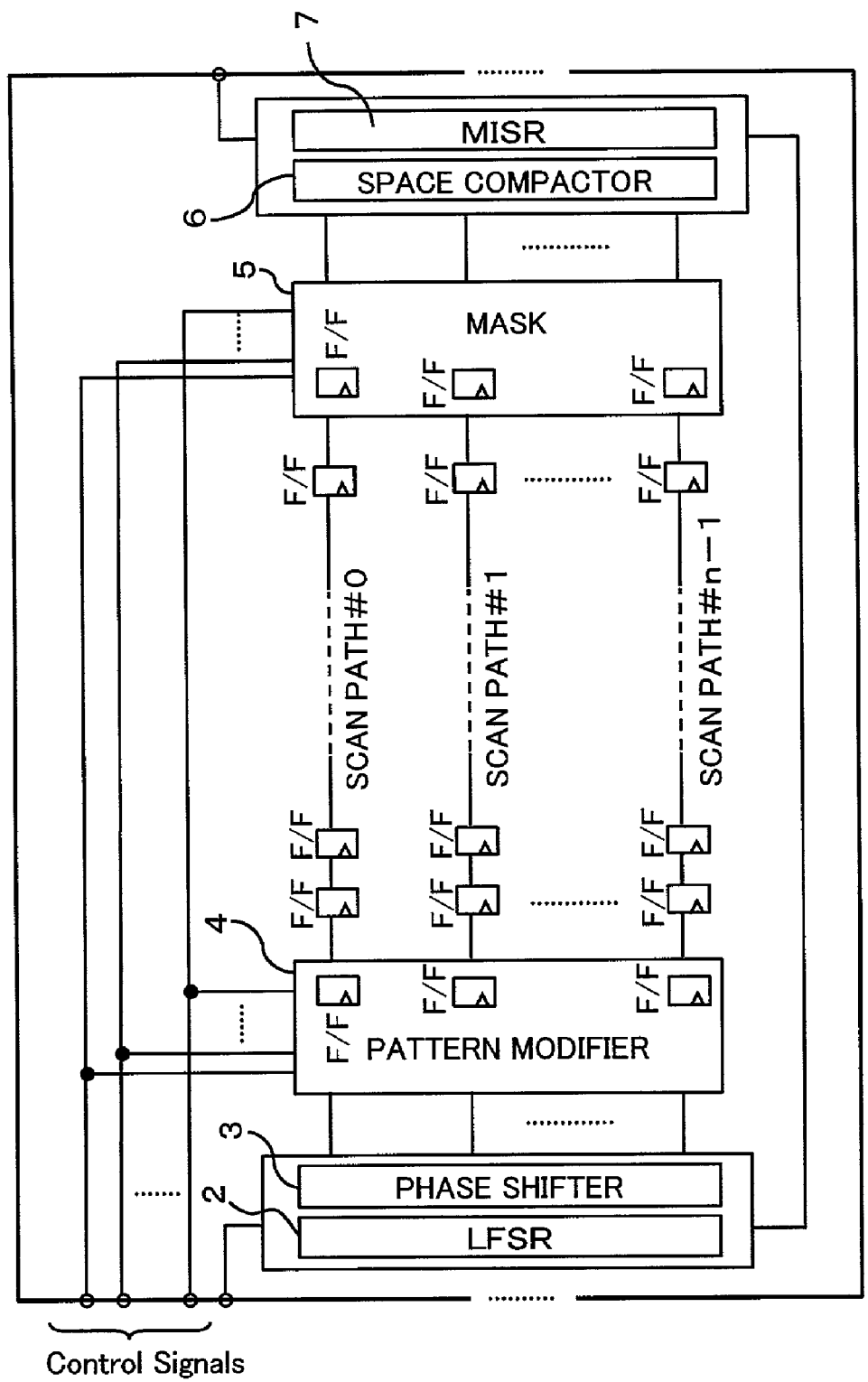
FIG. 3 is a block diagram showing a structure of a testing apparatus for an integrated circuit according to a first embodiment of this invention.

FIG. 3 is a block diagram showing a structure of a testing apparatus for an integrated circuit according to a first embodiment of this invention. As shown in FIG. 3, the testing apparatus according to the first embodiment comprises a linear feedback shift register (LFSR) 2, a phase shifter 3, a pattern modifier 4, scan paths #0, #1, . . . , and #n−1, a mask 5, a space compactor 6, and a multiple input signature register (MISR) 7. This testing apparatus is built in an LSI that is an integrated circuit, which is a target of the test.

Pseudo random patterns generated by the LFSR 2 are inputted to the pattern modifier 4 through the phase shifter 3. Control signals from a tester (not shown) are inputted to the pattern modifier 4 through control input pins or the like. The pattern modifier 4 modifies only a value for an F/F required to be set a value according to the control signals, and inputs and sets the value to the lead F/F of each of the scan paths #i (i=0, 1, . . . , and n−1).

The mask 5 masks an indeterminate value (X state) among values of the last F/Fs of the scan paths #i according to the control signal inputted from the control input pin or the like, converts the indeterminate state into the defined state, and inputs the value of the last F/F of each of the scan paths #i to the space compactor 6. The space compactor 6 compresses a value of the last F/F of each of the scan paths #i into about the number of bits (for example, 32 bits) of the MISR 7, and inputs it to the MISR. The MISR 7 further compresses compressed data from the space compactor 6, and stores it.

Figure 4:
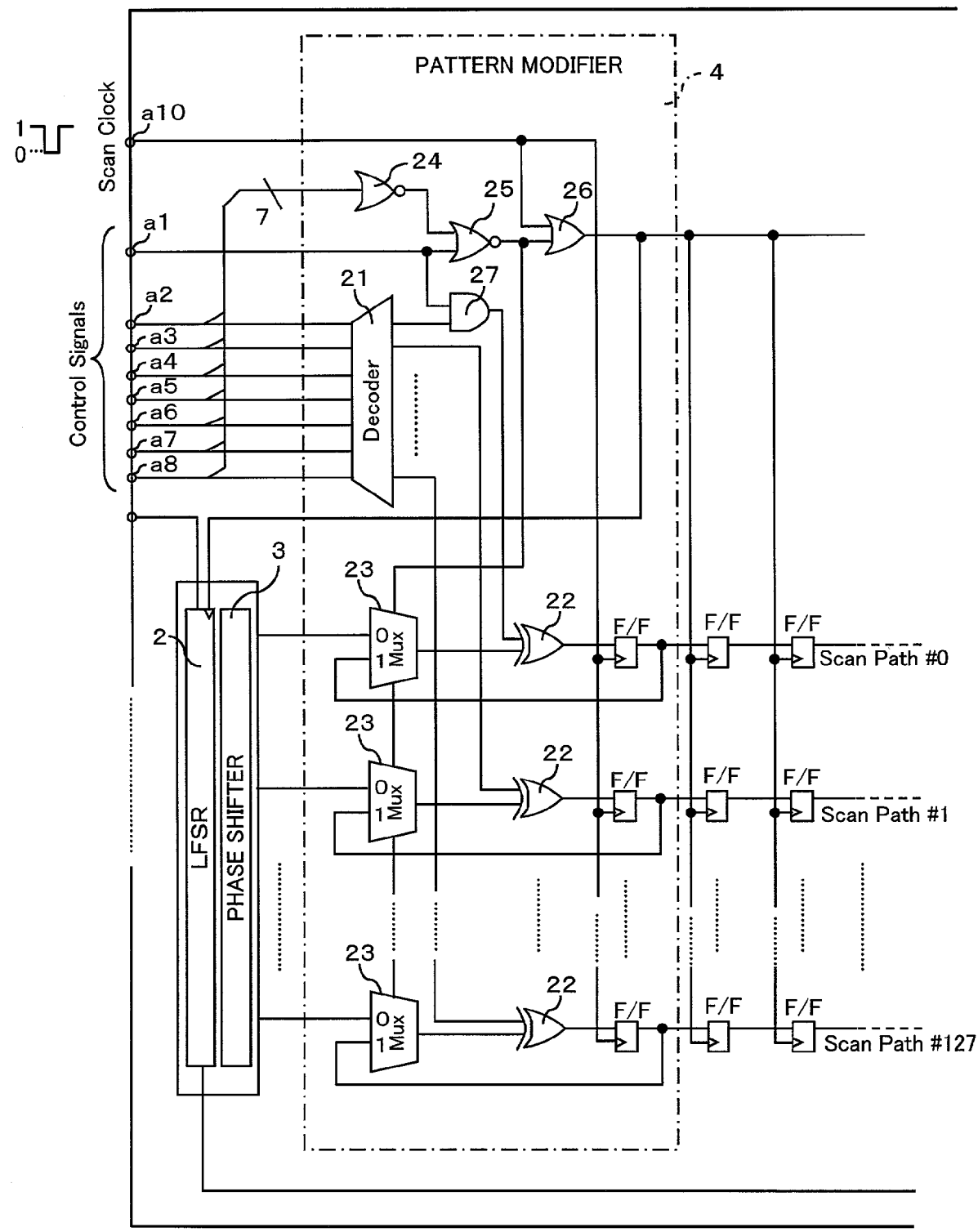
FIG. 4 is a block diagram showing in detail a structure of a pattern generating part in the testing apparatus according to the first embodiment of this invention.

FIG. 4 is a block diagram showing in detail a structure of a pattern generating part in the testing apparatus according to the first embodiment. In the example shown in FIG. 4, the LFSR 2 as the pattern generator is assumed to have 128 scan paths (n=128). As shown in FIG. 4, the pattern generating part of this embodiment is configured with the LFSR 2 and the phase shifter 3, wherein the LFSR 2 generates pseudo random patterns and inputs 128 random bit sequences to the pattern modifier 4 through the phase shifter 3.

Other than this, the control signals are inputted to the pattern modifier 4 from the tester (not shown) through the eight control input pins (a1 to a8). The 128 scan paths #0, #1, . . . , and #127 are connected to the pattern modifier 4. A result of modification (output) of the pattern modifier 4 is inputted to the lead F/F of each of the scan paths #i (i=0, 1, . . . , and 127). An output of the lead F/F of each scan path #i is fed back to the input's side of the lead F/F in the pattern modifier 4.

The pattern modifier 4 also controls a shift clock to the LFSR 2 (and the MISR 7) and a shift clock to the F/F on each of the scan paths #0, #1, . . . , and #127, thus can separately apply a shift clock to the lead F/F of each scan path #i.

The pattern modifier 4 has a decoder circuit (Decoder) 21 to which lower seven bits (a2 to a8) of the control input are inputted. According to a result of decoding by the decoder circuit 21, a signal value inputted to a specific one of the 128 scan paths #0, #1, . . . , and #127 can be inverted by an EOR circuit 22. A code given as control signals to the control input pins a1 to a8 and an operation corresponding to the described in more detail in below Table 1.

TABLE 1

| code | operation |
| --- | --- |
| 00000000 | random pattern shift |
| 00000001 | invert a value of the lead F/F on the scan path #1 |
| 00000010 | invert a value of the lead F/F on the scan path #2 |
| . | . |
| . | . |
| 01111111 | invert a value of the lead F/F on the scan path #127 |
| 10000000 | random pattern shift to invert only an input value of the scan path #0 |
| 10000001 | random pattern shift to invert only an input value to the scan path #1 |

TABLE 1-continued

| code | operation |
| --- | --- |
| 10000010 | random pattern shift to onvert only an input value to the scan path #2 |
| . | . |
| . | . |
| 11111111 | random pattern shift to invert only an input value ro the scan path #127 |

When all bits of the control input is "0", a shift clock (negative clock; Scan Clock) is supplied to the LFSR 2 and all the F/Fs on the scan paths through the input pin a10, and the random bit sequences created at the preceding clock by the LFSR 2 are shifted-in as they are to the scan paths.

Namely, since the lower seven bits (a2 to a8) of the control input are "0", an output of an NOR circuit 24 is "1". Since the most significant bit (a1) of the control input is "0", an output of an NOR circuit 25 is "0". For this, multiplexers (Muxs) 23 transmits signals from the phase shifter 3 to the EOR (exclusive OR) circuits 22. The shift clock from the input pin a10 is directly supplied to the lead F/Fs on the scan paths, and is supplied to the LFSR 2 and the F/Fs excepting the lead F/Fs on the scan paths through an OR (logical sum) circuit 26. Incidentally, an AND circuit 27 is to prevent inversion of an input from the LFSR 2 to the scan path #0 when all bits of the control input is "0".

When the control input is "10000000" to "11111111", the shift clock is supplied to the LFSR 2 and all F/Fs on the scan paths, and random bit sequences created by the LFSR 2 at the preceding clock are shifted-in to the scan paths. At this time, only a value of one scan path designed by the lower seven bits (a2 to a8) of the control input is inverted by the EOR circuit 22.

Namely, since any one of the lower seven bits (a2 to a8) of the control input is "1", an output of the NOR circuit 24 is "0". Since the most significant bit (a1) of the control input is "1", an output of the NOR circuit 25 is "0". For this, the multiplexer 23 transmits signals from the phase shifter 3 to the EOR circuits 22. The shift clock from the input pin a10 is directly supplied to the lead F/Fs of the scan paths, and is supplied to the LFSR 2 and F/Fs excepting the lead F/Fs on the scan paths through the OR circuit 26. At this time, "1" is inputted to the EOR circuit 22 for one scan path designated by the lower seven bits of the control input from the decoder circuit 21. For this, a signal from the multiplexer 23 is inverted by the EOR circuit 22, then outputted to the lead F/F of the designated scan path.

When the control input is "00000001" to "01111111", the shift clock is supplied to only the lead F/F of the scan path, whereby not an output from the LFSR 2 but outputs from the lead F/Fs become effective and fed back to the lead F/Fs. At this time, only a value of one scan path designated by the lower seven bits (a2 to a8) of the control input is inverted by the EOR circuit 22. By this operation, only a value of the lead F/F of the scan path designated by the lower seven bits of the control input is inverted.

Namely, since any one of the lower seven bits "a2 to a8" of the control input is "1", an output of the NOR circuit 24 is "0". Since the most significant bit "a1" of the control input is "0", an output of the NOR circuit 25 is "1". For this, the shift clock from the input pin a10 is supplied to the lead F/Fs of the scan paths. However, the shift clock is not supplied to the LFSR 2 and F/Fs excepting the lead F/Fs on the scan path since an output of the OR circuit 26 becomes "1" due to an output of the NOR circuit 25. The multiplexer 23 transmits outputs from the leading F/Fs to the EOR circuits 22 according to the output "1" from the NOR circuit 25. At this time, "1" is inputted from the decoder circuit 21 to the EOR circuit 22 for one scan path designated by the lower seven bits of the control input, so that the signal from the multiplexer 23 is inverted by the EOR circuit 22, then outputted to the leading F/F of the designated scan path.

FIG. 5 is a diagram for illustrating setting of random numbers (pseudo random patterns) and the ATPG. In a table of random numbers in FIG. 5, there are shown random numbers (pseudo random patterns) to be set to the F/Fs generated by the LFSR 2. In the table of ATPG in FIG. 5, "-" corresponds to an F/F to which a value does not need to be set, whereas "1" and "0" are values to be set to F/Fs by the ATPG. Since the ATPG can grasp random numbers generated by the LFSR 2 by simulating an operation of the LFSR 2, the ATPG can find a value that needs to be modified in the table of random numbers. In FIG. 5, values surrounded by broken lines in the table of the ATPG differ from values in the table of random numbers. According to this embodiment, only differing parts are modified by the pattern modifier 4.

Concrete examples of input patterns for setting arbitrary values to the internal F/Fs using the circuit shown in FIG. 4 are shown in below Table 2.

TABLE 2

| pattern number | code | operation |
|---|---|---|
| 1 | 00000000 | random pattern shift |
| 2 | 10000011 | random pattern shift to invert only an input value to the scan path #3 |
| 3 | 00000000 | random pattern shift |
| 4 | 10000001 | random pattern shift to invert only an input value to the scan path #1 |
| 5 | 00000100 | invert a value of the lead F/F on the scan path #4 |
| 6 | 01111111 | invert a value of the lead F/F on the scan path #127 |
| 7 | 00000000 | random pattern shift |

In the examples shown above, seven patterns are supplied from the tester. Since all the bits are "0" in the first pattern (pattern number 1), a random pattern shifting operation is carried out. Since the control signals inputted to the control input pins a1, a7 and a8 are "1" in the second pattern (pattern number 2), a random pattern shifting operation of inverting only an input value to the scan path #3 ("0" being inverted to "1") is carried out. Since all the bits are again "0" in the third pattern (pattern number 3), the random pattern shifting operation is carried out.

In the fourth pattern to the sixth pattern, one stage of the scan paths is shifted, and input values to the scan paths for three bits are inverted. In concrete, since the control signal inputted to the control input pins a1 and a8 are "1" in the fourth pattern (pattern number 4), a random pattern shifting operation of inverting only a value of the scan path #1 ("0" being inverted to "1") is carried out. Since only the control signal inputted to the control input pin a6 is "1" in the fifth pattern (pattern number 5), only a value of the lead F/F of the scan path #4 is inverted ("1" being inverted to "0"). Since all the lower seven bits are "1" in the sixth pattern (pattern number 6), only a value of the lead F/F of the scan path #127 is inverted ("1" being inverted to "0"). In the fifth pattern and the sixth pattern, the shift clock is not supplied to the LFSR 2 and F/Fs on the scan paths excepting the lead F/Fs. Since all the bits are again "0" in the seventh pattern (pattern number 7), the random pattern shifting operation is carried out.

Figure 6:
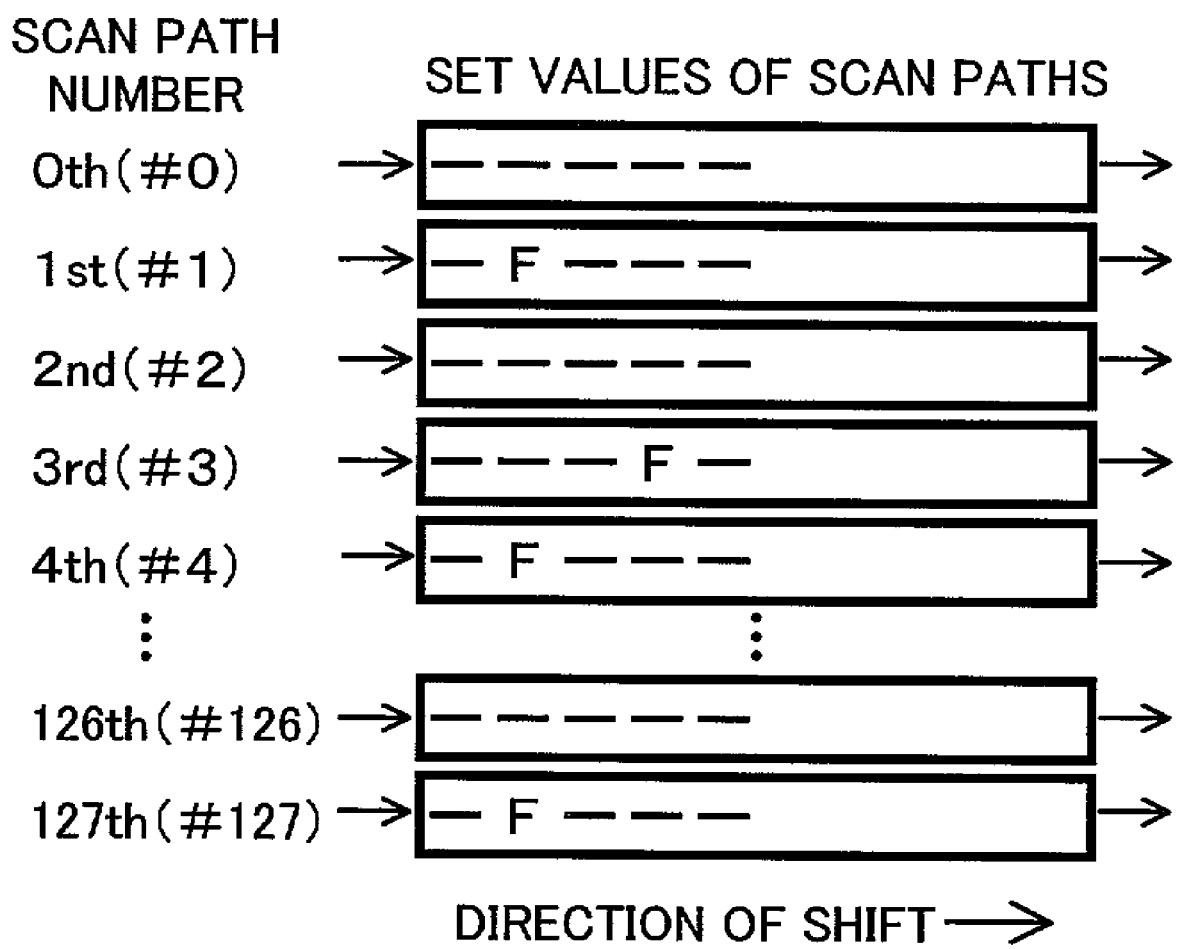
FIG. 6 is a diagram for illustrating shift results of examples of input patterns according to the first embodiment of this invention.

Values of the F/Fs on the scan paths at the time that the above seven patterns are applied from the tester are shown in FIG. 6. FIG. 6 is a diagram for illustrating a result of the shift of the input pattern example according to the first embodiment. In FIG. 6, "-" represents an F/F to which a random pattern from the LFSR 2 is set, whereas "F" represents an F/F to which a value of the random pattern which has been inverted is set since a value of the random pattern of the LFSR 2 differs from a value required by the ATPG.

In the above manner, values required by the ATPG can be set to the internal F/Fs. Namely, when pure random pattern shifting and inverting of only one bit are carried out, the shifting of one stage is completed with one pattern. However, when not less than two bits are inverted, patterns in number equal to inverted bits are required for the shifting of one stage. From the fact shown in FIG. 2, increase of the patterns caused by inverting multiple bits hardly occurs, but multiple scan paths allow improvement of the degree of parallelizing so that the testing time can be shortened. Additionally, a quantity of data to be stored in the tester can be decreased according to the degree of parallelizing.

Figure 23:
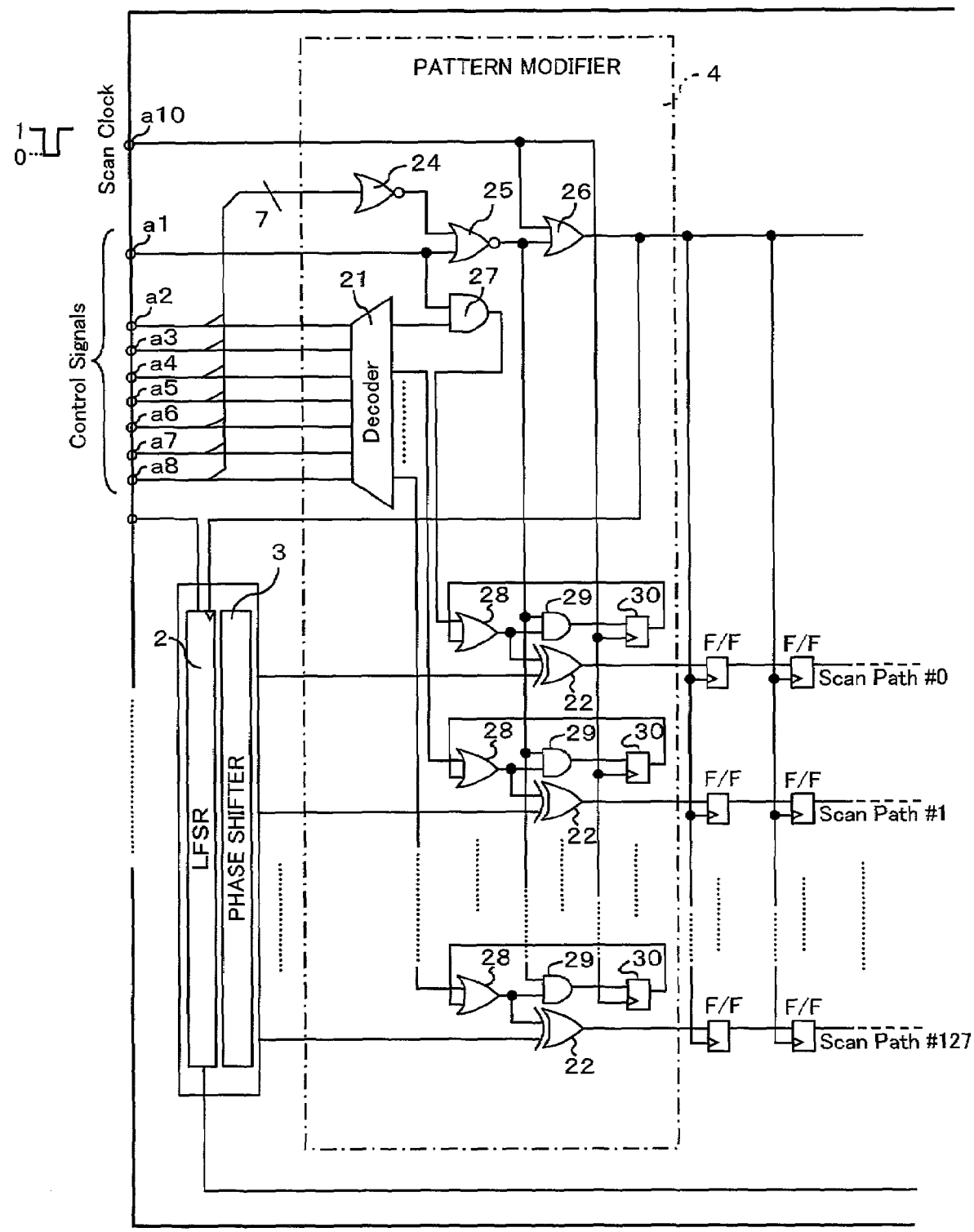
FIG. 23 is a block diagram showing in detail another structure of the pattern generating part in the testing apparatus according to the first embodiment of this invention.

FIG. 23 is a block diagram showing in detail another structure of the pattern generating part in the testing apparatus according to the first embodiment of this invention. The pattern modifier 4 shown in FIG. 23 comprises, instead of the multiplexers 23 shown in FIG. 4, OR (logical sum) circuits 28, AND (logical product) circuits 29, and F/Fs 30 each holding the inverted state independently of the lead F/F on the scan path. The overhead of the circuit is increased a little because the structure as shown in FIG. 23 is employed as a structure of the pattern modifier 4, but it becomes easy to completely separate the LFSR (pattern generator) 2 from the scan paths #0 to #127 to modularize them, and a reordering process of optimizing the order of the scan F/Fs at the time of layout for physical placement and routing becomes possible.

Figure 7:
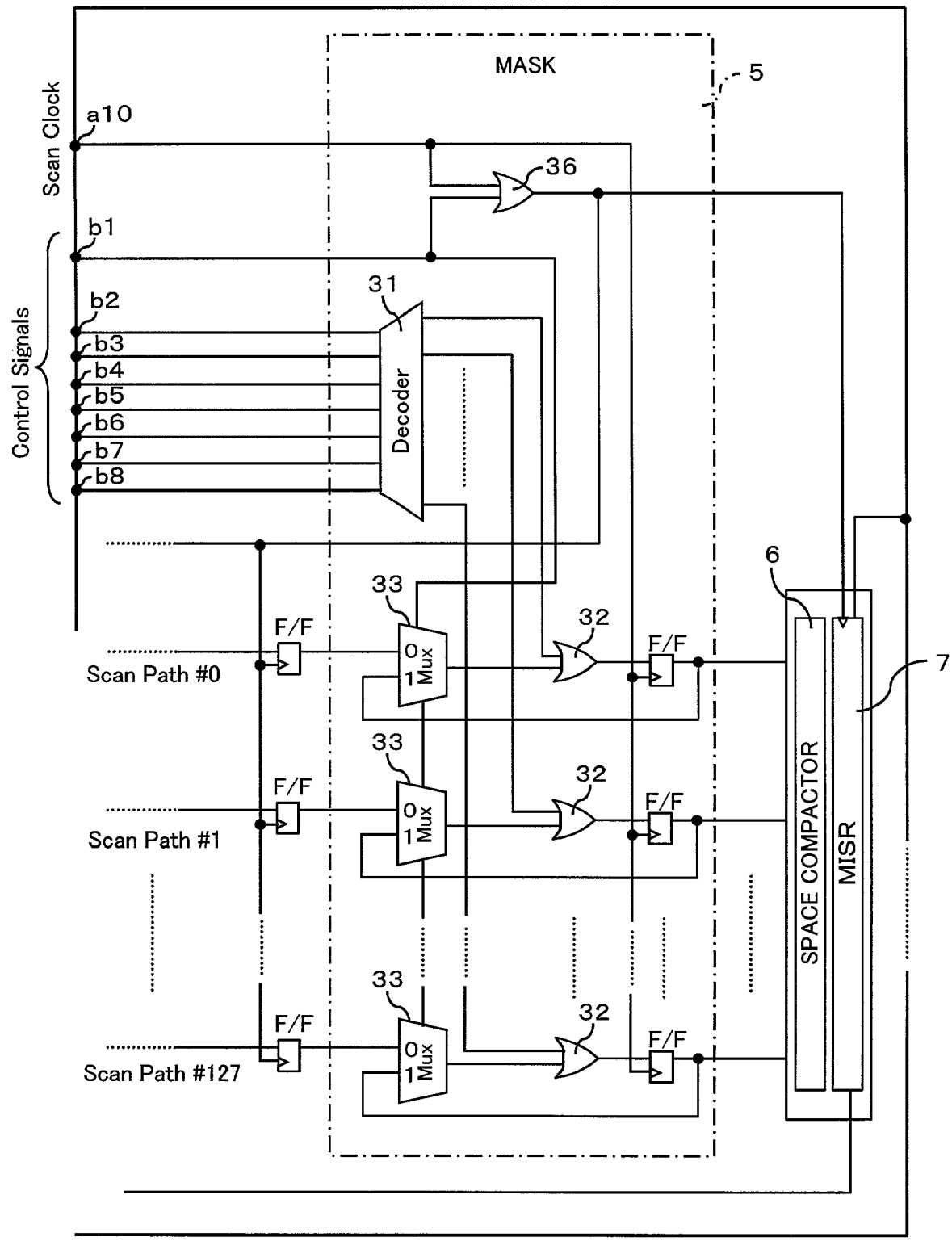
FIG. 7 is a block diagram showing in detail a structure of an output verifying part in the testing apparatus according to the first embodiment of this invention.

FIG. 7 is a block diagram showing in detail a structure of an output verifying part in the testing apparatus according to the first embodiment. In the example shown in FIG. 7, the MISR 7 as the output verifier is assumed to have 128 scan paths (n=128). As shown in FIG. 7, the output verifying unit according to this embodiment comprises the MISR 7 and the space compactor 6, where outputs of the 128 scan paths #0, #1, . . . , and #127 are compressed to about the number of bits of the MISR 7 by the space compactor 6, and the compressed data is further compressed by the MISR 7 and stored.

To the mask 5, the control signals are inputted through the eight control input pins (b1 to b8). Additionally, outputs from the last F/Fs and outputs of the preceding F/Fs of the last F/Fs on the 128 scan paths #0, #1, . . . , and #127 are inputted to the mask 5. In the mask 5, an output of the last F/F on each scan path #i is fed back to the input side of the last F/F.

The mask 5 controls a shift clock to the MISR 7 (and to LFSR 2) and a shift clock to the F/Fs on the scan paths. When the indeterminate state is masked, only the shift clock for the last F/Fs of the scan paths #0, #1, . . . , and #127 is applied, whereas the shift clock for other F/Fs on the scan paths and the MISR 7 (and LFSR 2) is suppressed.

The mask 5 enables the masking operation at the highest bit (b1) of the control input, and has the decoder circuit (Decoder) 31 to which lower seven bits of the control input are inputted. According to a result of decoding of the decoder circuit 21, an indeterminate state value (X state value) inputted to a specific one of the 128 scan paths #0, #1, . . . , and #127 is converted to a "1" state value (or a "0" state value) by the OR circuit (or the AND circuit), and the indeterminate value is masked.

Namely, when "1" is inputted to the control input pin b1, an output of the OR circuit 36 becomes "1". Accordingly, the shift clock (negative clock; Scan clock) to F/Fs other than the last F/Fs on the scan paths and the MISR 7 (and the LFSR 2) is suppressed, and the multiplexers 33 feed back outputs of the last F/Fs according to "1" of the control input pin b1, and output them to the OR circuits 32. For this, "1" is outputted from the decoder circuit 31, the indeterminate value (X state value) inputted to a specific one of the 128 scan paths #0, #1, . . . , and #127 is converted to the "1" state value by the OR circuit 32, whereby the indeterminate value is masked. When there is the indeterminate value in an F/F on another scan path at the same time, an output (the indeterminate value) from the F/F is masked at the next shift clock.

Figure 24:
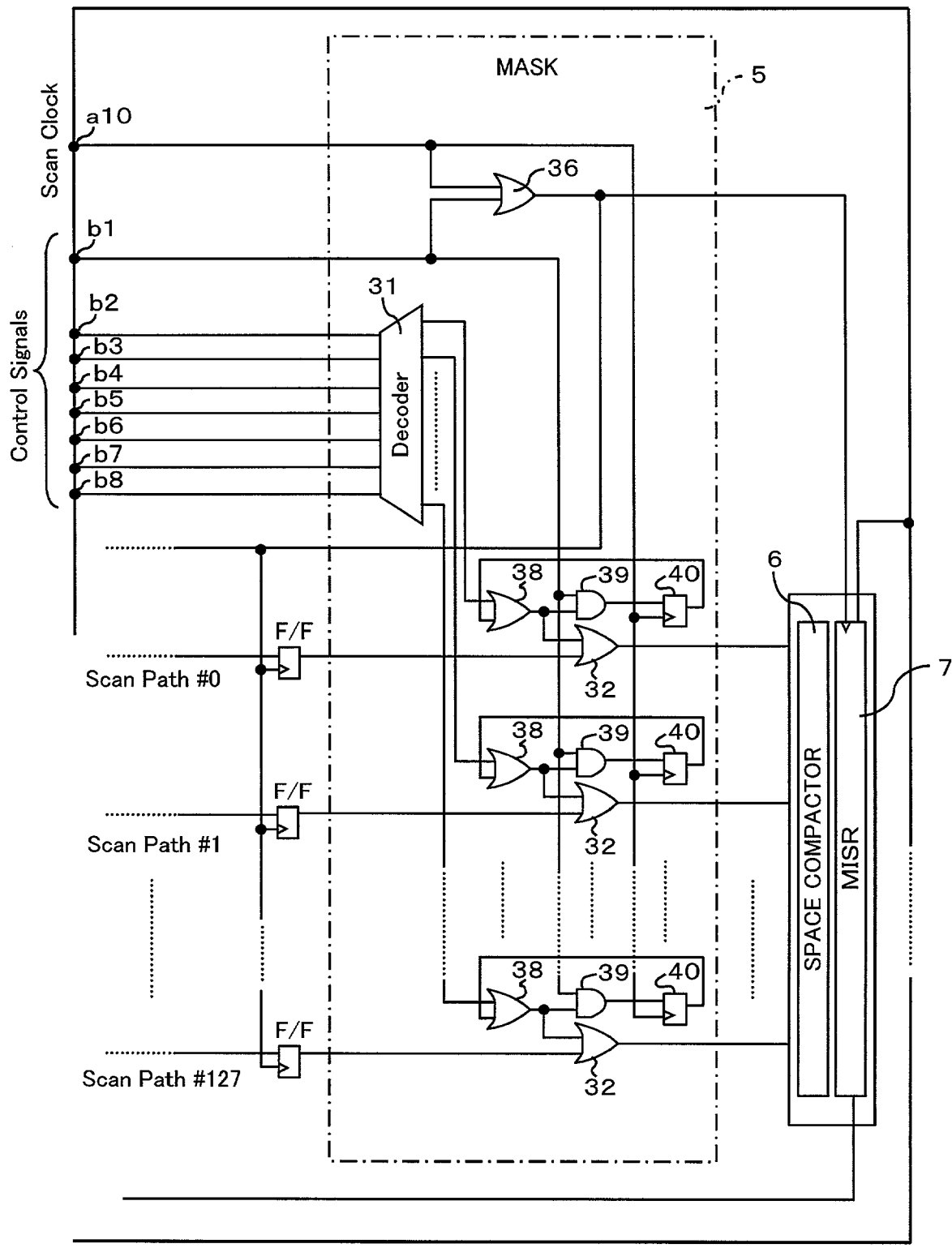
FIG. 24 is a block diagram showing in detail another structure of the output verifying part in the testing apparatus according to the first embodiment of this invention.

FIG. 24 is a block diagram showing in detail another structure of the output verifying part in the testing apparatus according to the first embodiment of this invention. The mask 5 shown in FIG. 24 comprises, instead of the multiplexers 33 shown in FIG. 7, OR (logical sum) circuits 38, AND (logical product) circuits 39, and F/Fs 40 each holding the inverted state independently of the last F/F on the scan path. The overhead of the circuit is increased a little because a structure as shown in FIG. 24 is employed as the structure of the mask 5, but it becomes easy to completely separate the MISR 7 as an output verifier from the scan paths #0 to #127 to modularize them, and a reordering process of optimizing the order of the scan F/Fs at the time of layout for physical replacement and routing becomes possible.

Although the pattern generating part and the output verifying part are basically independent, it is possible to share the lower seven bits of the control input when the both circuits are commonly applied.

Using the above testing apparatus according to the first embodiment, a deterministic test pattern generated by the ATPG can be applied to an integrated circuit (LSI) within a short time. In concrete, by increasing the number of the internal scan paths by k times, it is possible to shorten the testing time to about 1/k.

Concurrently, it is possible to decrease a quantity of data to be stored in the tester. In concrete, by increasing the number of the internal scan paths by k times, it is possible to decrease the memory quantity to 1/k.

Although a pattern generator (LFSR 2 or the like) used in BIST is used in the first embodiment, a severe design limitation such as inserting a specific control circuit for the bus circuit, a circuit at a test point to improve the detection ratio, or the like is not placed on the designer since a deterministic pattern is applied to the inside. A pattern compactor (MISR 7 or the like) used in BIST can be used. Using the mask 5, it is possible to prevent propagation of the indeterminate state inside the circuit, so that it is possible to prevent that the verification becomes impossible.

Further, the above integrated circuit (LSI), the LFSR 2, the phase shifter 3, the pattern modifier 4, the scan paths #0, #1, . . . , and #n–1, the mask 5, the space compactor 6, the MISR 7 and the like can be simulated on the computer, and the test data can be created before an actual integrated circuit is manufactured.

According to the testing apparatus and the testing method of the first embodiment of this invention, test patterns generated by the LFSR 2 built in the integrated circuit (LSI) are modified by the pattern modifier 4, and inputted to the n scan paths #0, 1, . . . , and #n–1. It is thereby possible to increase the number of the scan paths, and decrease the number of stages of the scan path, thus the testing time of the integrated circuit (LSI) is largely shortened.

According to this embodiment, problems of DSPT and BIST can be overcome, and a test pattern enabling a high quality test having advantages of the both within a short time can be created. At this time, only significant data (information on F/Fs to which values are required to be set) is supplied from the tester (external input) and modified, so that a quantity of the data to be stored in the tester can be largely decreased. Accordingly, a high quality test becomes possible without placing severe design limitations on the designer and without an expensive tester.

An indeterminate value in outputs from the n scan paths #0, #1, . . . , and #127 configured with F/Fs inside the integrated circuit is masked, and a masked output result is verified by the MISR 7, so that the indeterminate state (X state) does not spoil a result of compression even if the output results from the F/Fs are compressed and read out to the outside.

The MISR 7 has a compressing means to compress output results having been masked, so that the output results from the internal F/Fs can be efficiently stored in the MISR 7.

In the case where pseudo random patterns created by the LFSR 2 are interpolated on the basis of the ATPG patterns as done in the testing apparatus according to the first embodiment, increase of overhead is expected due to the modifying operation (inverting operation) when the number of modification points (inversion points) is increased. In a second to fourth embodiment, description will be made of a pattern generating method used in a testing apparatus similar to that according to the first embodiment, in which the number of modification points is decreased to decrease a quantity of pattern modification by the pattern modifier 4, thereby to suppress the increase of overhead to a minimum.

[4] Description of Second Embodiment

Figure 8:
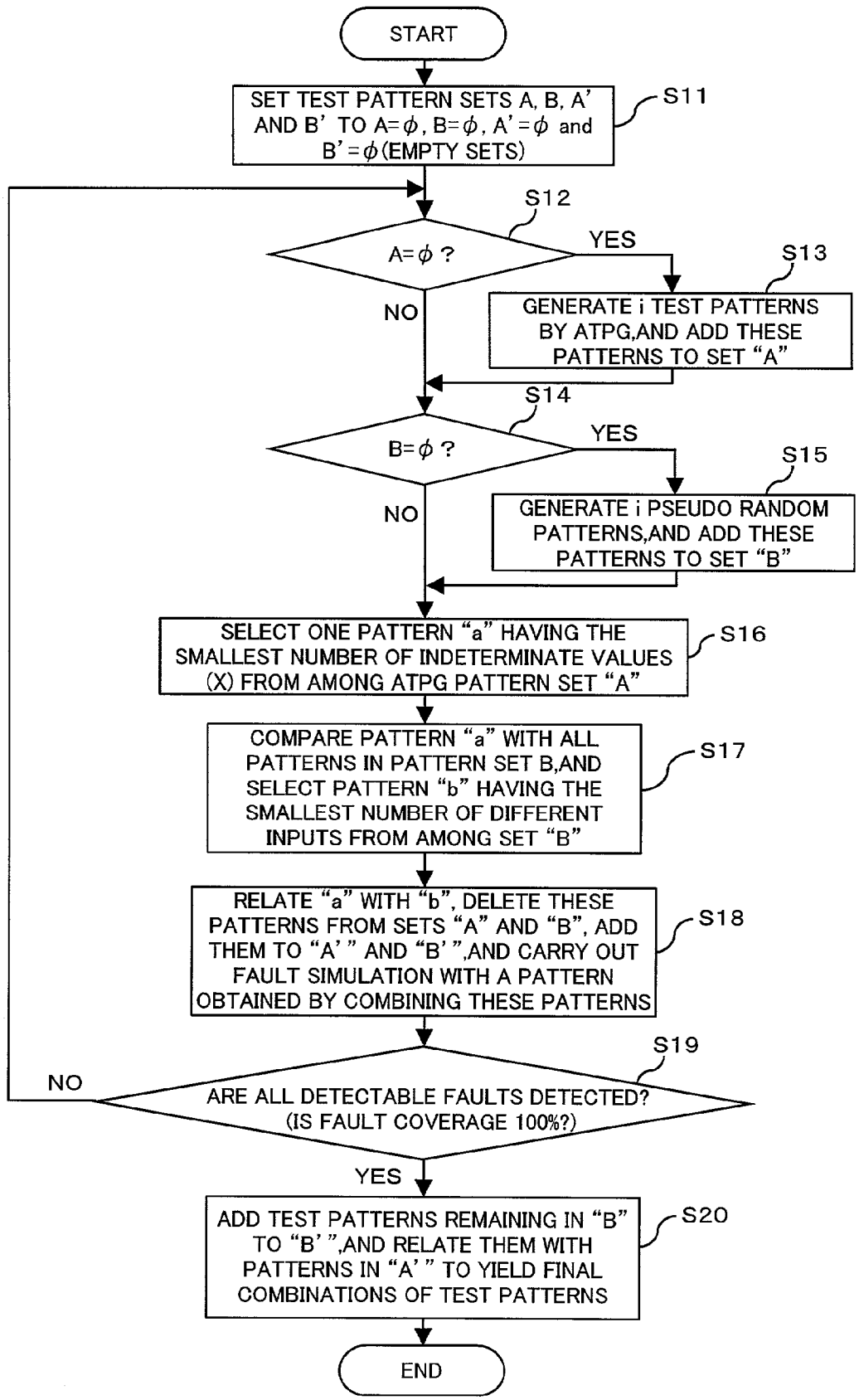
FIG. 8 is a flowchart for illustrating an operation of a testing apparatus for an integrated circuit according to a second embodiment of this invention.

Next, a pattern generating method according to a second embodiment applied to a testing apparatus similar to that of the first embodiment will be described with reference to FIGS. 8 through 12. FIG. 8 is a flowchart for illustrating an operation of the testing apparatus for an integrated circuit according to the second embodiment. FIGS. 9 through 12 are diagrams for illustrating concrete examples of the pattern modifying operation according to the second embodiment of this invention.

The testing apparatus according to the second embodiment is configured similarly to that according to the first embodiment. An ATPG pattern is given from the ATPG (automatic test pattern generating unit; not shown) to the pattern modifier 4, and a pseudo random pattern generated by the LFSR 2 is interpolated and modified on the basis of the ATPG pattern.

According to the second embodiment, the pattern modifier 4 selects a suitable combination of a pseudo random pattern and an ATPG pattern from a plurality of pseudo random patterns and a plurality of ATPG patterns at this time, and modifies the selected pseudo random pattern on the basis of the selected ATPG pattern. This procedure will be now described with reference to a flowchart (steps S11 to S20) shown in FIG. 8. A process performed according to the procedure shown in FIG. 8 may be carried out in the pattern modifier 4, or in the control unit (not shown) such as a CPU or the like managing the operation of the testing apparatus of this embodiment.

First, four test pattern sets A, B, A' and B' are defined, and all of these sets A, B, A' and B' are initialized to empty set (φ) (step S11).

It is then determined whether the set "A" is an empty set or not (step S12). When the set "A" is an empty set (YES route at step S12), the ATPG (automatic test pattern generating unit; not shown) generates i test patterns (ATPG patterns), and these ATPG patterns are added to the set "A" (step S13). When the number of i is large at this time, fault simulation may be carried out. A reference for selecting a target fault corresponds to the known ATPG process.

When the set "A" is not an empty set (NO route at step S12), or after the ATPG patterns are added to the set "A" at step S13, it is determined whether the set B is an empty set or not (step S14). When the set B is an empty set (YES route at step S14), the LFSR 2 generates j pseudo random patterns, and these patterns are added to the set B (step S15).

When the set B is not an empty set (NO route at step S14), or after the pseudo random patterns are added to the set B at step S15, one ATPG pattern a having the smallest number of bits of "don't care" [bits in the indeterminate state (X)] is selected in the ATPG pattern set "A" (step A16).

The selected ATPG pattern a is compared with all pseudo random patterns in the test pattern set "B", and one pseudo random pattern having the smallest number of values (inputs) differing from values of bits of the ATPG pattern "a" is selected in the set "B" (step S17).

The ATPG pattern "a" and the pseudo random pattern "b" selected as above are related with each other, and these patterns "a" and "b" are deleted from the sets "A" and "B" and added to the sets "A'" and "B'". Fault simulation is carried out using a pattern obtained by combining these two patterns "a" and "b" (a result of modification of the pseudo random pattern "b" on the basis of the ATPG pattern "A" by the pattern modifier 4) (step S18).

After that, it is determined whether detectable faults are all detected or not, that is, whether the fault coverage is 100% or not (step S19). When the fault coverage is not 100% (NO route at step S19), the procedure returns to step S12, and the process similar to the above is repeated.

When the fault coverage is 100% (YES route at step S19), pseudo random patterns remaining in the set "B" are added to the set "B'", each of the random patterns is related with the ATPG patterns of the set "A'" to yield combinations of final test patterns (step S20). Here, for the pseudo random pattern finally added from the set "B" to the set "B'", no corresponding ATPG pattern in the set "A'" exists. An arrangement of the patterns corresponds to the order in which the pseudo random patterns were generated.

FIG. 9 shows practical examples in which patterns are combined in the order in which the patterns were created (in the order in which the patterns appeared) without a process of changing combinations of the above ATPG patterns and pseudo random patterns. In the examples shown in FIG. 9, three ATPG patterns DP1, DP2 and DP3, and three pseudo random patterns RP1, RP2 and RP3 are successively created, and combined in the order in which they were created. As shown in FIG. 9, when these patterns in three sets are related with one another in the order in which they were created, and the pseudo random patterns are modified by the pattern modifier 4, the number of F/Fs having set values to be inverted and modified is six. Incidentally, m in parenthesis represents the number of values to be inverted and modified in each of the pseudo random pattern.

When the ATPG pattern DP1 "1X000X11X" and the pseudo random pattern RP1 "011010110" are combined, three values, that is, the first, third and fifth bits from the lead bit, of the pseudo random pattern RP1 differ. For this, the pattern modifier 4 inverts these three values, and outputs a modified pattern "110000110" (m=3). Similarly, when the ATPG pattern DP2 "X01XX1XXX" and the pseudo random pattern RP2 "001010101" are combined, only one value, that is, the sixth value from the lead bit, of the pseudo random pattern RP2 differs. For this, the pattern modifier 4 inverts this one value, and outputs a modified pattern "001011101" (m=1). Similarly, when the ATPG pattern DP3 "0XXX1X1X0" and the pseudo random pattern RP3 "110110111" are combined, two values, that is, the first and ninth bits from the lead bit, of the pseudo random pattern RP3 differ. For this, the pattern modifier 4 inverts these two values, and outputs a modified pattern "010110110" (m=2).

FIG. 10 shows practical examples in the case where a process of changing combinations of the ATPG patterns and the pseudo random patterns as described above with reference to FIG. 8 (in the case of i=j=3 in FIG. 8) is performed on the same patterns in FIG. 9. When the above combination changing process is performed, the three ATPG patterns are rearranged in the ascending order of indeterminate values X (that is, in the descending order of signal values that are not indeterminate values X) to DP1, DP3 and DP2 (refer to steps S16 and S17 in FIG. 8), as shown in FIG. 10. One having the smallest number of F/Fs whose set values are to be inverted and modified with respect to the ATPG pattern DP1, DP3 and DP2 is selected among the pseudo random patterns RP1, RP2 and RP3, and the pseudo random patterns RP1, RP2 and RP3 are related in order (refer to step S18 in FIG. 8).

In the examples shown in FIG. 10, the pseudo random pattern RP3 having the smallest number of F/Fs whose set values are to be inverted and modified is related with the ATPG pattern DP1. Similarly, the pseudo random pattern RP1 having a smaller number of F/Fs whose set values are to be inverted and modified between the remaining two pseudo random patterns is related with the ATPG pattern DP2. Finally, the pseudo random pattern RP2 is related with the remaining ATPG pattern DP2. The combination changing process (relating process) as above is performed, then the modifying operation by the pattern modifier 4 is performed. When such the process is performed, the number of F/Fs whose set values are to be inverted and modifies is three, so that a quantity of modification can be decreased as compared with the manner shown in FIG. 9. Incidentally, m in parenthesis is the number of values to be inverted and changed in each pseudo random pattern, as above.

Now, the examples shown in FIG. 10 will be concretely described. In such the above combination changing process, the ATPG pattern DP1 "1X000X11X" and the pseudo random pattern RP3 "110110111" are combined. Since two values, that is, the fourth and fifth bits from the lead bit, of the pseudo random pattern RP3 differ in this combination, the pattern modifier 4 inverts these two values, and outputs a modified pattern "110110111" (m=2). Next, the ATPG pattern DP3 "0XXX1X1X0" and the pseudo random pattern RP1 "011010110" are combined. Since there is not a bit having a different value in this combination, the pattern modifier 4 outputs the pseudo random pattern RP1 "011010110" as it is without the modifying operation (m=0). Finally, the ATPG pattern DP2 "X01XX1XXX" and the pseudo random pattern PR2 "001010101" are combined. Since one value, that is, the sixth bit from the lead bit, of the pseudo random pattern RP2 differs in this combination, the pattern modifier 4 inverts this one value, and outputs a modified pattern "001011101" (m=1).

FIG. 11 shows practical examples in the case where ATPG patterns and pseudo random patterns are combined in the order in which they were created without the above process of changing combinations of these patterns similarly to the examples shown in FIG. 9. In the examples shown in FIG. 11, six ATPG patterns DP1 to DP6 and six pseudo random patterns RP1 to RP6 are successively created, and combined in the order in which they were created (in the order in which they appeared). When these six patterns are related in the order in which they were created, and the pseudo random patterns are modified by the pattern modifier 4, the number of F/Fs whose set values are to be inverted and changed is 12, as shown in FIG. 11. Incidentally, m in parenthesis represents the number of values to be inverted and changed in each pseudo random pattern in FIG. 11, as well. Here, concrete descriptions of the examples shown in FIG. 11 are omitted.

FIG. 12 shows practical examples in the case where the process of changing combinations of the ATPG patterns and the pseudo random patterns (in the case where i=j=3 in FIG. 8) is performed on the same patterns as those in FIG. 11, as described above with reference to FIG. 8. In this case, the six ATPG patterns DP1 to DP6 and the six pseudo random patterns RP1 to RP6 are divided into two groups, that is a front part and a rear part, the process of changing combinations of the three ATPG patterns DP1 to DP3 and the three pseudo random patterns RP1 to RP3 is performed, after that, the process of changing the combinations of the three ATPG patterns DP4 to DP6 and the three pseudo random patterns RP4 to RP6 is performed. Whereby, the ATPG patterns DP1, DP2 and DP3 are related with the pseudo random patterns RP3, RP2 and RP1, respectively, whereas the ATPG patterns DP4, DP5 and DP6 are related with the pseudo random patterns RP5, RP4 and RP6, respectively. Such the combination changing process (relating process) is performed, then the modifying operation by the pattern modifier 4 is performed. By such the process, the number of F/Fs whose set values are to be inverted and changed is seven. Accordingly, a quantity of modification can be largely reduced as compared with the manner shown in FIG. 11. Incidentally, in FIG. 12, m in parenthesis represents the number of values to be inverted and changed in each pseudo random pattern, as above. Concrete descriptions of the examples shown in FIG. 12 are omitted.

The testing apparatus according to the second embodiment of this invention selects a suitable combination of a pseudo random pattern and an ATPG random pattern among a plurality of pseudo random patterns and a plurality of ATPG patterns, and modifies the pseudo random pattern using the selected ATPG pattern as a reference for the modification, thereby largely decreasing a quantity of pattern modification by the pattern modifier 4 to efficiently modify the pattern. This leads to a more efficient test on an integrated circuit.

[5] Description of Third Embodiment

Figure 13:
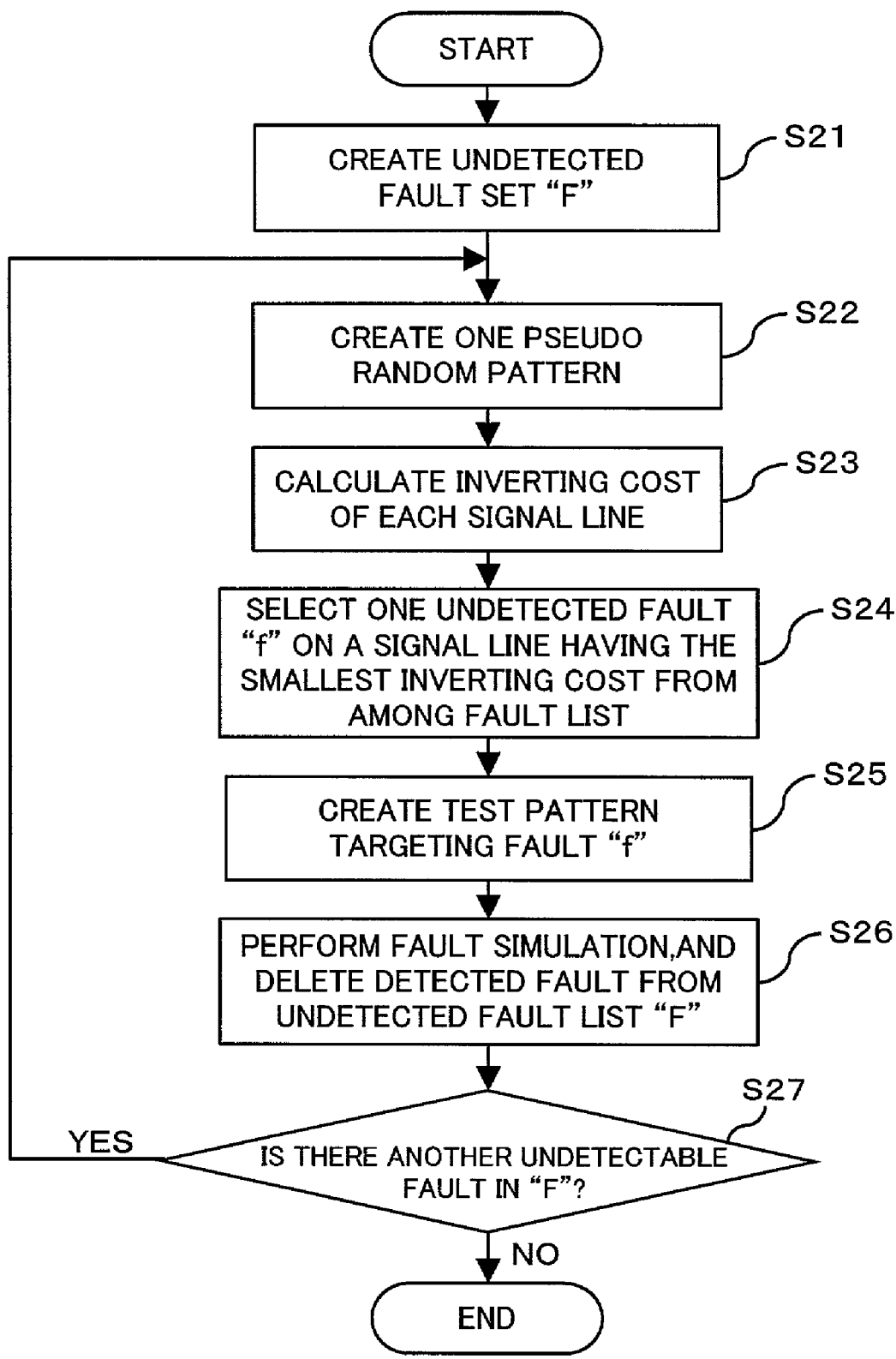
FIG. 13 is a flowchart for illustrating an operation of a testing apparatus for an integrated circuit according to a third embodiment of this invention.
Figure 14:
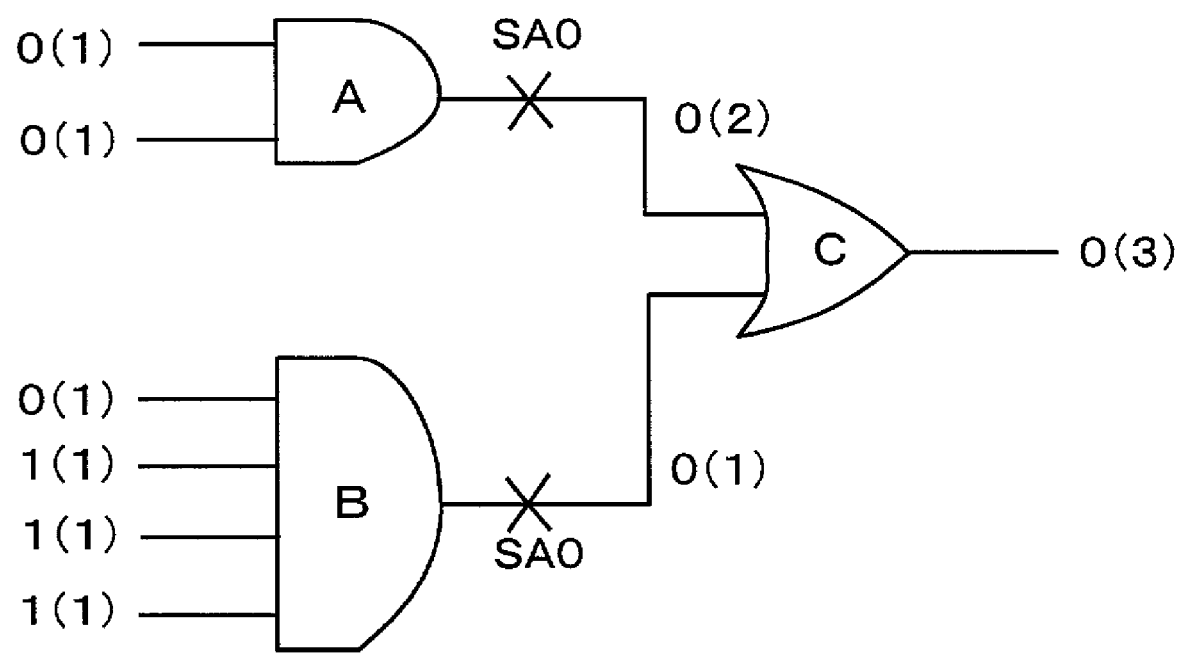
FIG. 14 is a diagram for illustrating a practical example of an ATPG pattern generating operation according to the third embodiment of this invention.

Next, a pattern generating method as a third embodiment applied to a testing apparatus similar to that according to the first embodiment will be described with reference to FIGS. 13 and 14. FIG. 13 is a flowchart for illustrating an operation of the testing apparatus for an integrated circuit according to the third embodiment of this invention. FIG. 14 is a diagram for illustrating a practical example of an ATPG pattern generating operation according to the third embodiment of this invention.

The testing apparatus according to the third embodiment is configured similarly to that according to the first embodiment, in which ATPG patterns are given from the ATPG (automatic test pattern generating unit; not shown) to the pattern modifier 4, and pseudo random patterns generated by the LFSR 2 are interpolated and modified on the basis of the ATPG patterns by the pattern modifier 4.

At this time, according to the third embodiment, the ATPG refers to each pseudo random pattern generated by the LFSR 2, selects a suitable target fault corresponding to the pseudo random pattern, generates an ATPG pattern that can detect the target fault as a reference for modification of that pseudo random pattern, and gives it to the pattern modifier 4. This procedure will be now described with reference to a flowchart (steps S21 to S27) shown in FIG. 13. A process according to the procedure shown in FIG. 13 may be performed in the ATPG or in the control unit (not shown) such as a CPU or the like managing the operation of the testing apparatus according to this embodiment.

First, an undetected fault set (undetected fault list) "F" is created (step S21). One pseudo random pattern is created by the LFSR 2 (step S22). An inverting cost of each signal line is calculated for the generated pseudo random pattern (step S23). One undetected fault "f" on a signal line having the smallest inverting cost is selected in the undetected fault list "F" (step S24). Incidentally, the inverting cost will be described later with reference to FIG. 14.

An ATPG pattern targeting the selected fault "f" (detection target) is created (step S25), fault simulation is performed using a pattern (a result of modification of the pseudo random pattern on the basis of the ATPG pattern by the pattern modifier 4) obtained by combining the generated ATPG pattern and the above pseudo random pattern, and the detected fault "f" is deleted from the undetected fault list "F" (step S26). After that, it is determined whether there is another undetected fault in the undetected fault list (step S27). When there is an undetected fault (YES route at step S27), the procedure goes back to step S22, and a process similar to the above is repeatedly carried out. When there is not undetected fault (NO route at step S27), the process is terminated.

Next, inverting cost and a reference for selecting a detection target fault (target) with an ATPG pattern will be described with reference to FIG. 14. In a logic circuit shown in FIG. 14, a stuck-at-0 fault on an output signal line of an AND gate "A" and a stuck-at-0 fault on an output signal line of an AND gate "B" are assumed to remain as undetected faults in the undetected fault list with a certain pseudo random pattern generated by the LFSR 2 being given. Assuming that, as inputs to six input signal lines (input pins) of the logic circuit shown in FIG. 14, "000111" are generated as the pseudo random pattern by the LFSR 2. Here, generation of an ATPG pattern for detecting the above two kinds of the stuck-at-0 fault is considered. Incidentally, the logic circuit shown in FIG. 14 comprises the AND gate "A" with two inputs, the AND gate "B" with four inputs, and an OR gate "C" outputting OR between these AND gates "A" and "B".

First, a cost to invert an output value (inverting cost) is calculated for each gate. When a cost required to invert an input signal to each input signal line is assumed to be "1", a cost required to invert an output value of an AND gate outputting a "0" value is equal to a sum of costs of input signal lines to which "0" is inputted. Conversely, a cost required to invert an output value of an AND gate outputting a "1" value is equal to the lowest cost among costs of input signal lines. A value inside parenthesis in FIG. 14 is a cost required for inversion obtained through the above calculation.

Next, a reference to select a detection target fault (target) with an ATPG pattern is considered. In the example shown in FIG. 14, in order to detect the stuck-at-0 fault at an output of the AND gate "A", an output value of the AND gate "A" needs to be "1". In order to detect the stuck-0 fault at an output of the AND gate "B", an output value of the AND gate "B" needs to be "1". At this time, a cost required to invert the output value is "2" for the AND gate "A", and "1" for the AND gate "B" according to the above calculating manner. The cost for the AND gate "B" is lower than that for the AND gate "A". Namely, when the stuck-0 fault of the AND gate "B" is targeted, the number of F/Fs whose set values are to be inverted is smaller.

When a target fault is selected using general controllability, the AND gate "A" has smaller 1-controllability than the AND gate "B", so that the AND gate "A" is selected. For this, the stuck-0 fault of the AND gate "A" is targeted. This indicates that an ATPG pattern generated in the method according to the third embodiment has a smaller quantity of modification of a pseudo random pattern than an ATPG pattern created using controllability.

When a target fault is selected as above, the ATPG creates an ATPG pattern (for example, "XX1XXX", "001111" or the like) in which a value of the third bit from the lead bit will be inverted and modified from "0" to "1" b y the pattern modifier 4 with respect to the pseudo random pattern "000111" shown in FIG. 14, and gives it to the pattern modifier 4.

According to the testing apparatus of the third embodiment of this invention, the ATPG refers to each pseudo random pattern from the LFSR 2, selects such a target fault (suitable target fault according to the pseudo random pattern) that the number of flips of F/Fs is smaller, and generates an ATPG pattern with which the target fault can be detected, and the pattern modifier 4 uses the ATPG pattern as a reference for modifying the pseudo random pattern. It is thereby possible to decrease a quantity of modification of a pattern by the pattern modifier 4, efficiently modify the pattern, thus a test on the integrated circuit can be carried out more efficiently.

[6] Description of Fourth Embodiment

Figure 15:
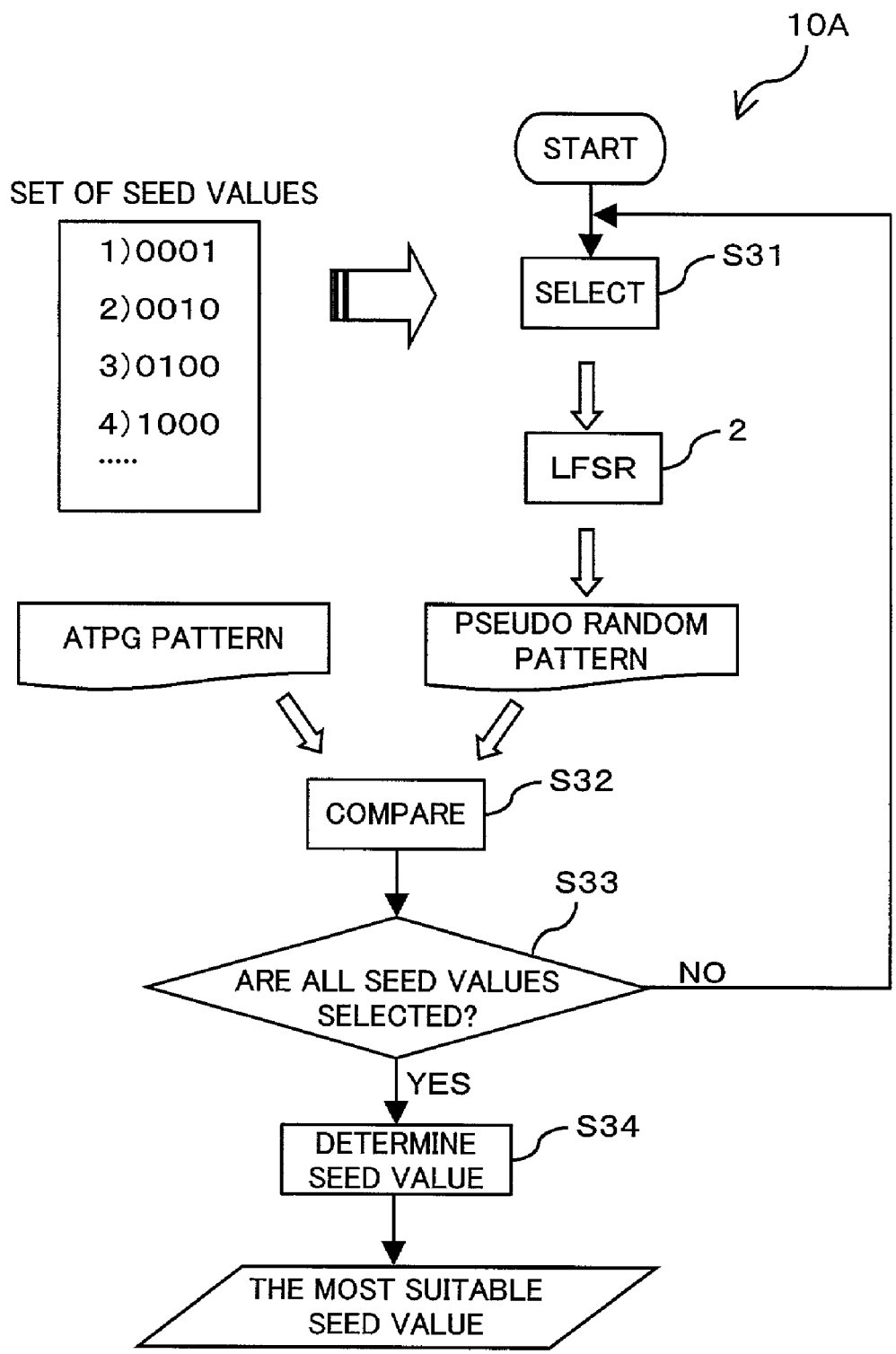
FIG. 15 is flowchart for illustrating a first example (seed value determining operation) of a characteristic information determining operation in a testing apparatus for an integrated circuit according to a fourth embodiment of this invention.
Figure 16:
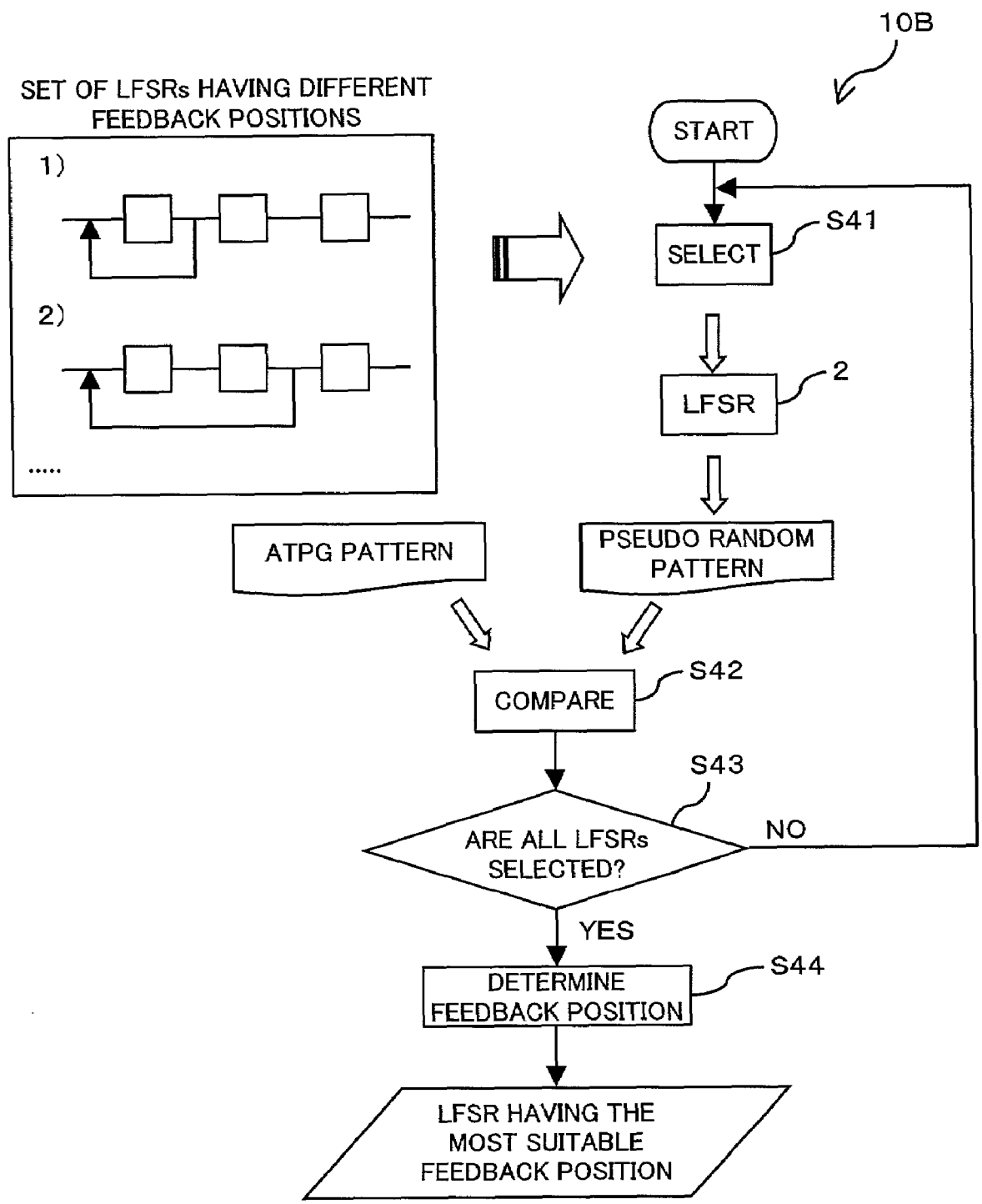
FIG. 16 is a flowchart for illustrating a second example (feedback position determining operation) of the characteristic information determining operation in the testing apparatus for an integrated circuit according to the fourth embodiment of this invention.

Next description will be made of a pattern generating method according to a fourth embodiment applied to a testing apparatus similar to that according to the first embodiment, with reference to FIGS. 15 and 16. FIG. 15 is a flowchart for illustrating a first example (seed value determining operation) of a characteristic information determining operation in the testing apparatus for an integrated circuit according to the fourth embodiment of this invention. FIG. 16 is a flowchart for illustrating a second example (feedback position determining operation) of the characteristic information determining operation in the testing apparatus for an integrated circuit according to the fourth embodiment of this invention.

The testing apparatus according to the fourth embodiment is configured almost similarly to that according to the first embodiment, in which ATPG patterns are given from the ATPG (automatic test pattern generating unit; not shown) to the pattern modifier 4, and pseudo random patterns generated by the LFSR 2 are interpolated and modified on the basis of the ATPG patterns by the pattern modifier 4.

However, in the testing apparatus according to the fourth embodiment, a characteristic information determining unit (refer to a reference character 10A in FIG. 15 or a reference character 10B in FIG. 16) is further added to the testing apparatus of the first embodiment. The characteristic information determining unit compares pseudo random patterns generated by the LFSR 2 with ATPG patterns, and determines characteristic information on the LFSR 2 that can make the LFSR 2 generate pseudo random patterns analogous to the ATPG patterns. The characteristic information determining unit may be provided with the LFSR 2, or the control unit (not shown) such as a CPU or the like managing the operation of the testing apparatus according to this embodiment may fulfil a function as the above characteristic information determining unit. In the testing apparatus according to the fourth embodiment, the LFSR 2 generates a pseudo random pattern on the basis of characteristic information determined by the above characteristic information determining unit.

An LFSR generally used at present as a pseudo random pattern generator has a plurality of registers linearly connected, and feeds back a plurality of outputs from these registers to the lead input unit through an exclusive OR gate. A bit sequence generated by the LFSR 2 having such the structure differs depending on a position of the feedback or an initial value (seed value). Namely, by changing the feedback position or the seed value in the LFSR 2, a random number sequence having a different characteristic is generated. According to the fourth embodiment, the above characteristic information determining unit determines an appropriate seed value or feedback position as characteristic information on the LFSR 2 to enable the LFSR 2 to generate pseudo random patterns analogous to ATPG patterns, thereby decreasing a quantity of modification in the pattern modifier 4.

An operation of a seed value determining unit 10A in the case where the characteristic value determining unit is configured as the seed value determining unit 10A (refer to FIG. 15) for determining a seed value as characteristic information on the LFSR 2 will be now described with reference to the flowchart (steps S31 to S34) shown in FIG. 15.

A plurality of seed values (seed value set) to be set in the LFSR 2 are beforehand prepared. One seed value is then selected in the seed value set, and set it in the LFSR 2. The LSFR 2 is operated on the basis of the seed value (step S31). A pseudo random pattern generated on the basis of the seed value by the LFSR 2 is compared with an ATPG pattern (step S32). It is then determined whether the selecting and comparing process on all of the seed values in the seed value set is completed or not (step S33).

When the process is not completed (NO route at step S33), the procedure returns to step S31, a process similar to the above is repeated.

When the selecting and comparing process on all the seed values is completed (YES route at step S33), the most suitable seed value, that is, such a seed value as to enable the LFSR 2 to generate a pseudo random pattern most analogous to the ATPG pattern, is determined on the basis of a result of the comparison at step S32, and outputted (step S34).

Next, an operation of the feedback position determining unit 10B (refer to FIG. 16) in the case where the characteristic information determining unit 10B is configured as the feedback position determining unit for determining a feedback position as characteristic information on the LFSR 2, will be described with reference to the flowchart (steps S41 to S44) shown in FIG. 16.

Plural kinds of LFSRs (LFSR set) having different feedback positions are beforehand prepared, one LFSR is selected in the LFSR set to use it as the LFSR 2, and the LFSR 2 is operated (step S41). A pseudo random pattern generated by the LFSR 2 is compared with an ATPG pattern (step S42). It is then determined whether the selecting and comparing process on all kinds of LFSRs in the LFSR set is completed or not (step S43).

When the process is not completed (NO route at step S43), the procedure returns to step S41, and a process similar to the above is repeated.

When the selecting and comparing process on all kinds of LFSRs is completed (YES route at step S43), a feedback position that allows the LFSR 2 to generate a pseudo random pattern most analogous to the ATPG pattern, that is, an LFSR having the most suitable position, is determined on the basis of a result of the comparison at step S42 (step S44).

The testing apparatus according to the fourth embodiment of this invention determines characteristic information on the LFSR 2 that allows the LFSR 2 to generate pseudo random patterns analogous to an ATPG pattern, and generates pseudo random patterns on the basis of the characteristic information, thereby decreasing a quantity of pattern modification by the pattern modifier 4, and making a test on an integrated circuit more efficiently.

[7] Description of Fifth Embodiment

Meanwhile, the earlier generated is a pattern interpolated on the basis of ATPG in dynamic compaction, the larger is the number of F/Fs to which values for detecting the fault are to be set. This means that a quantity of modification of a pseudo random pattern is great in the initial stage in the test, thus the overhead becomes large. On the other hand, there are a lot of faults that can be easily detected in the initial stage in the test, it is thus expected that a lot of faults are detected even with a pseudo random pattern. In a fifth embodiment, description will be made of a pattern generating method using such characteristics, and two types of a testing apparatus to which the above pattern generating method is applied.

[7-1] Description of First Example of Structure

Figure 17:
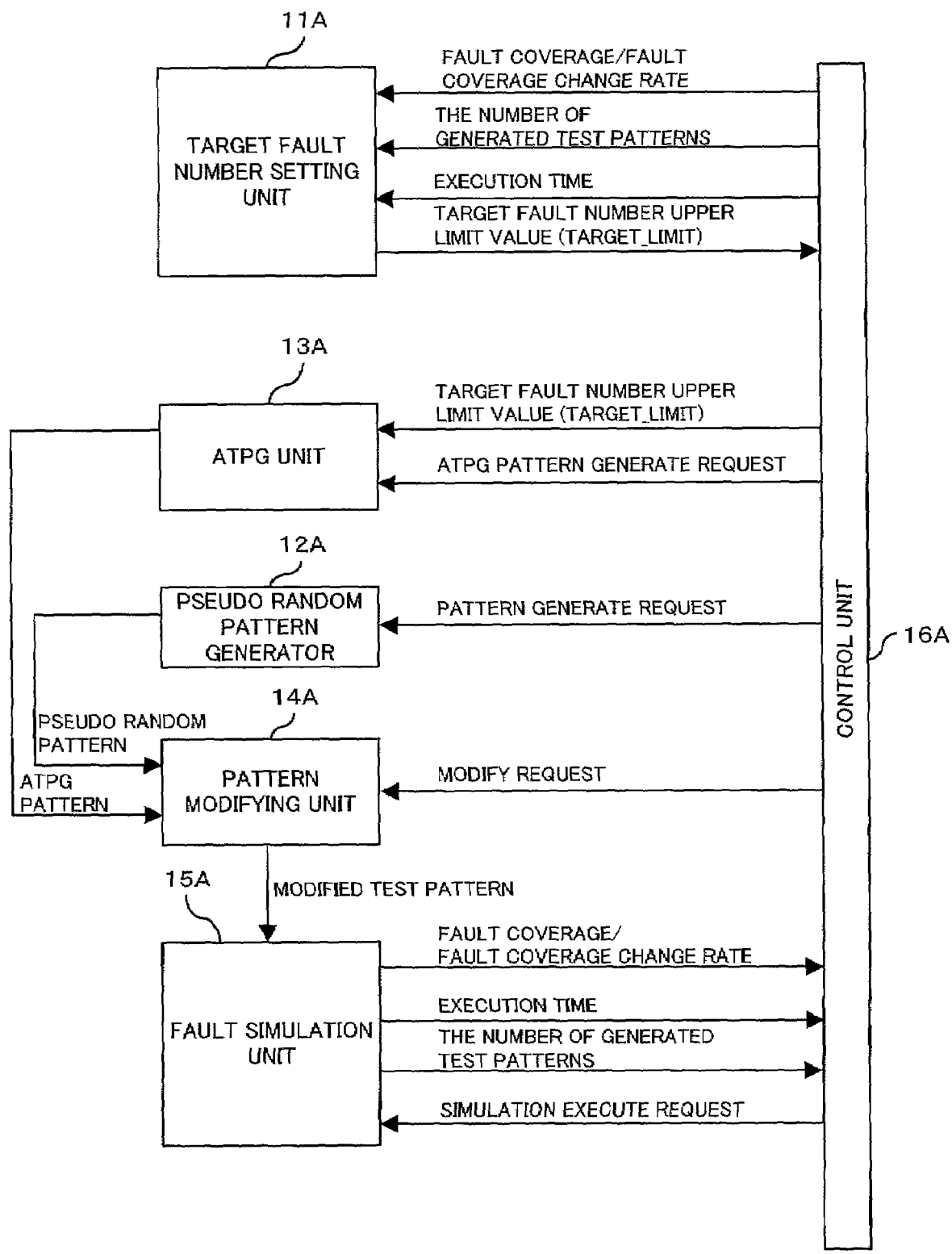
FIG. 17 is a block diagram showing a first example of structure of a testing apparatus for an integrated circuit according to a fifth embodiment of this invention.

FIG. 17 is a block diagram showing a first example of structure of a testing apparatus for integrated circuits according to the fifth embodiment of this invention. As shown in FIG. 17, the testing apparatus in the first example of structure according to the fifth embodiment comprises a target fault number setting unit 11A, a pseudo random pattern generating unit 12A, an ATPG unit 13A, a pattern modifying unit 14A, a fault simulation unit 15A, and a control unit 16A.

When the ATPG unit 13A executes a compressing process (dynamic compaction) on an ATPG pattern, the target fault number setting unit (execution limitation condition setting unit) 11A sets an execution limitation condition for limiting the execution of the compressing process. As the execution limitation condition, the target fault number setting unit 11A sets an upper limit value of the number of faults to be detected with one ATPG pattern, and such operates as to increase the upper limit value as generation of the ATPG pattern progresses.

Figure 18:
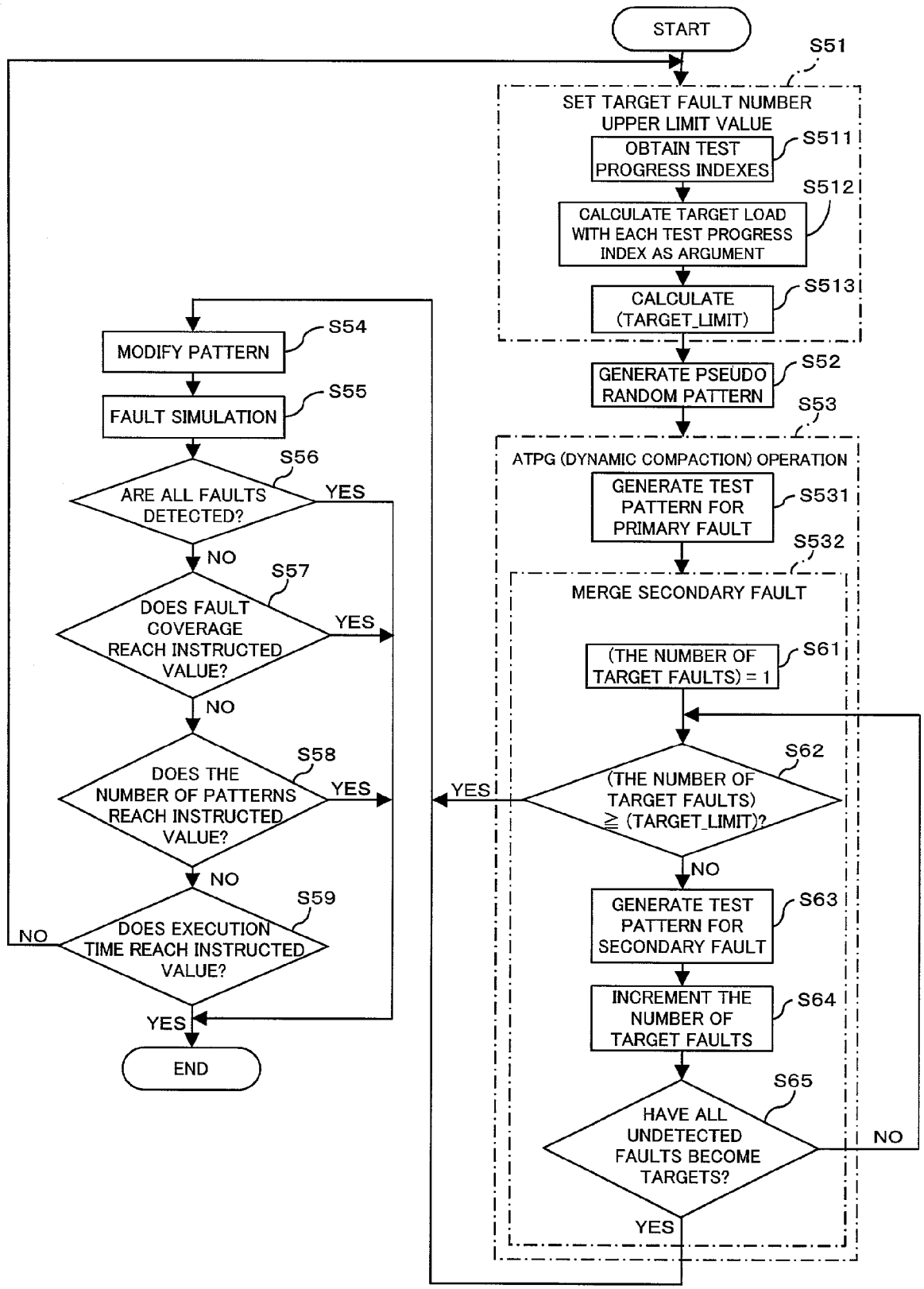
FIG. 18 is a flowchart for illustrating an operation of the first structural example shown in FIG. 17.

More concretely, the target fault number setting unit 11A obtains a fault coverage, a change rate of the fault coverage, the number of generated test patterns, an execution time (execution time of the pseudo random pattern generating unit 12A) and the like informed from the control unit 16A as indexes representing progress of the test, calculates a target load (w_target) as will be described later with reference to FIG. 18, calculates and sets a target fault number upper limit value (target_limit) that is an upper limit number of target faults on the basis of the target load and the number of undetected faults, and informs the control unit 16A of the target fault number upper limit value.

The pseudo random pattern generating unit (pattern generator) 12A corresponds to the LFSR 2 according to the first embodiment, which generates a pseudo random pattern using a random number generator realized by an LFSR.

The ATPG unit (automatic test pattern generating unit) 13A generates a test pattern in the dynamic compaction mode. Until the number of faults that are targets of compaction of the ATPG pattern exceeds the target fault number upper limit value (target_limit) set by the target fault number setting unit 11A (that is, until the execution limit condition is satisfied) or all undetected faults become target faults, the ATPG unit 13A repeats test pattern generation (compressing process) for secondary fault.

Namely, the ATPG unit 13A terminates the compressing process on the ATPG pattern when the number of detection target faults, that are compressed in the ATPG pattern by the compaction, reaches a target fault number upper limit value (target_limit) set by the target fault number setting unit 11A.

The pattern modifying unit (pattern modifier) 14A corresponds to the pattern modifier 4 according to the first embodiment. The pattern modifying unit 14A receives an ATPG pattern generated by the ATPG unit 13A and a pseudo random pattern generated by the pseudo random pattern generating unit 12A, compares the ATPG pattern and the pseudo random pattern, inverts and modifies values of input points differing from values of the ATPG pattern in the pseudo random pattern, and transfers the modified pseudo random pattern as a modified test pattern to the fault simulation unit 15A.

The fault simulation unit 15A receives the test pattern modified by the pattern modifying unit 14A, simulates (evaluates) undetected faults that can be detected with the test pattern, and informs the control unit 16A of test progress indexes specified by the simulation such as a fault coverage, a change rate of the fault coverage, an execution time, the number of generated test patterns and the like.

The control unit 16A controls operations of the above target fault number setting unit 11A, the pseudo random pattern generating unit 12A, the ATPG unit 13A, the pattern modifying part 14A and the fault simulation unit 15A. In concrete, the control unit 16A informs the target fault number setting unit 11A of test progress indexes, receives a target fault number upper limit value, informs the ATPG unit 13A of the target fault number upper limit value and an ATPG pattern generate request, informs the pseudo random pattern generating unit 12A of a pattern generate request, informs the pattern modifying unit 14A of a modify request, informs the fault simulation unit 15A of a simulation execute request, and receives the test progress indexes. When detecting all the faults, or when any one of the fault coverage, the number of generated patterns and the execution time reaches a instructed value, the control unit 16A terminates the process.

Next, description will be made of an operation of the testing apparatus configured as above according to a flowchart (steps S51 to S59) shown in FIG. 18 with reference to FIG. 17.

First, the target fault number setting unit 11A such calculates and sets the target fault number upper limit value (target_limit) that the target fault number upper limit value is sufficiently small in the initial stage of the test pattern generation and is increased as the test progresses, and informs the control unit 16A of it (step S51). At this time, the target fault number setting unit 11A obtains a fault coverage/ fault coverage change rate, the number of generated test patterns, an execution time and the like as test progress indexes from the control unit 16A (step S511), and calculates a target load (w_target) with these test progress indexes being as arguments (step S512). One example of equation for calculating a target load (w_target) from the a fault coverage is shown below:

$$(w\_target) = (fault\ coverage\ (\%))/100.0 \quad (1)$$

The target fault number setting unit 11A calculates and sets the target fault number upper limit value (target_limit) on the basis of the target load (w_target) calculated using the above equation (1) and the undetected fault number using, for example, an equation (2) below, and informs the control unit 16A of it (step S513).

$$(target\_limit) = (the\ number\ of\ undetected\ faults) * (w\_target) \quad (2)$$

After that, the control unit 16A informs the pseudo random pattern generating unit 12A of a pattern generate request to make the pseudo random pattern generating unit 12A generate a pseudo random pattern (step S52), and informs the ATPG unit 13A of the target fault number upper limit value (target_limit) and the ATPG pattern generate request to make the ATPG unit 13A execute ATPG pattern generation accompanied by dynamic compaction (step S53).

At this time, the ATPG unit 13A generates a test pattern for primary fault (step S531), then merges a test pattern to detect secondary fault (step S532). This merging process is performed at step S61 to S65 as below. Namely, "1" is set as an initial value of the number of target faults of an ATPG pattern during the merging process (the number of faults that are targets of compaction of an ATPG pattern; the number of target faults) (step S61), and it is determined whether the number of target faults reaches the target fault number upper limit value (target_limit) or not (step S62). When the number of target faults does not reach the upper limit value (NO route at step S62), a test pattern for secondary fault is generated and merged (step S63), the number of target faults is incremented by one (step S64), and it is determined whether all undetected faults become targets or not (step S65). When there is still an undetected fault (NO route at step S65), the procedure goes back to step S62, and a process similar to the above is performed. When there is no undetected fault (YES route at step S65), or when the number of target faults reaches the upper limit value (YES route at step S62), the ATPG unit 13A terminates the dynamic compaction.

The control unit 16A then informs the pattern modifying unit 14A of a modify request to make the pattern modifying unit 14A execute a pseudo random pattern modifying process (step S54). At this time, the pattern modifying unit 14A compares the ATPG pattern generated by the ATPG unit 13A with the pseudo random pattern generated by the pseudo random pattern generating unit 12A, and inverts and modifies values of input points differing from values of the ATPG pattern in the pseudo random pattern. The pseudo random pattern modified as above is transmitted as a modified test pattern to the fault simulation unit 15A.

The control unit 16A informs the fault simulation unit 15A of a simulation execute request to make the fault simulation unit 15A execute simulation with the modified test pattern (step S55). At this time, the fault simulation unit 15A simulates (evaluates) undetected faults that can be detected with the modified test pattern, and informs the control unit 16A of test progress indexes such as a fault coverage/fault coverage change rate, an execution time, the number of generated test patterns and the like specified by the simulation.

After the simulation, the control unit 16A determines whether all faults are detected or not (step S56), determines whether the fault coverage reaches a instructed value or not (step S57), determines whether the number of generated test patterns reaches an instructed value (limit value) or not (step S58), and determines whether the execution time reaches an instructed value (limit value) or not (step S59). When the determinations at step S56 to S59 all result in NO, the procedure returns to step S51, and a process similar to the above is performed. When any one of the determinations at step S56 to S59 results in YES, the process is terminated.

The testing apparatus according to the first example of structure of the fifth embodiment of this invention sets an upper limit value relating to the number of detection target faults when the ATPG unit 13A compresses detection target faults in dynamic compaction, terminates the compaction when the number of detection target faults reaches the upper limit value. The upper limit value is such set as to be small in the initial stage of the test pattern generation, and as to be increased as the test pattern generation progresses. It is thereby possible to suppress the number of request values (values other than indeterminate values) in the ATPG pattern. Particularly, a quantity of test pattern modification in the initial stage of test pattern generation is suppressed. Accordingly, it is possible to decrease a quantity of pattern modification by the pattern modifying unit 14A, which allows efficient pattern modification, and a more efficient test on an integrated circuit.

[7-2] Description of Second Example of Structure

Figure 19:
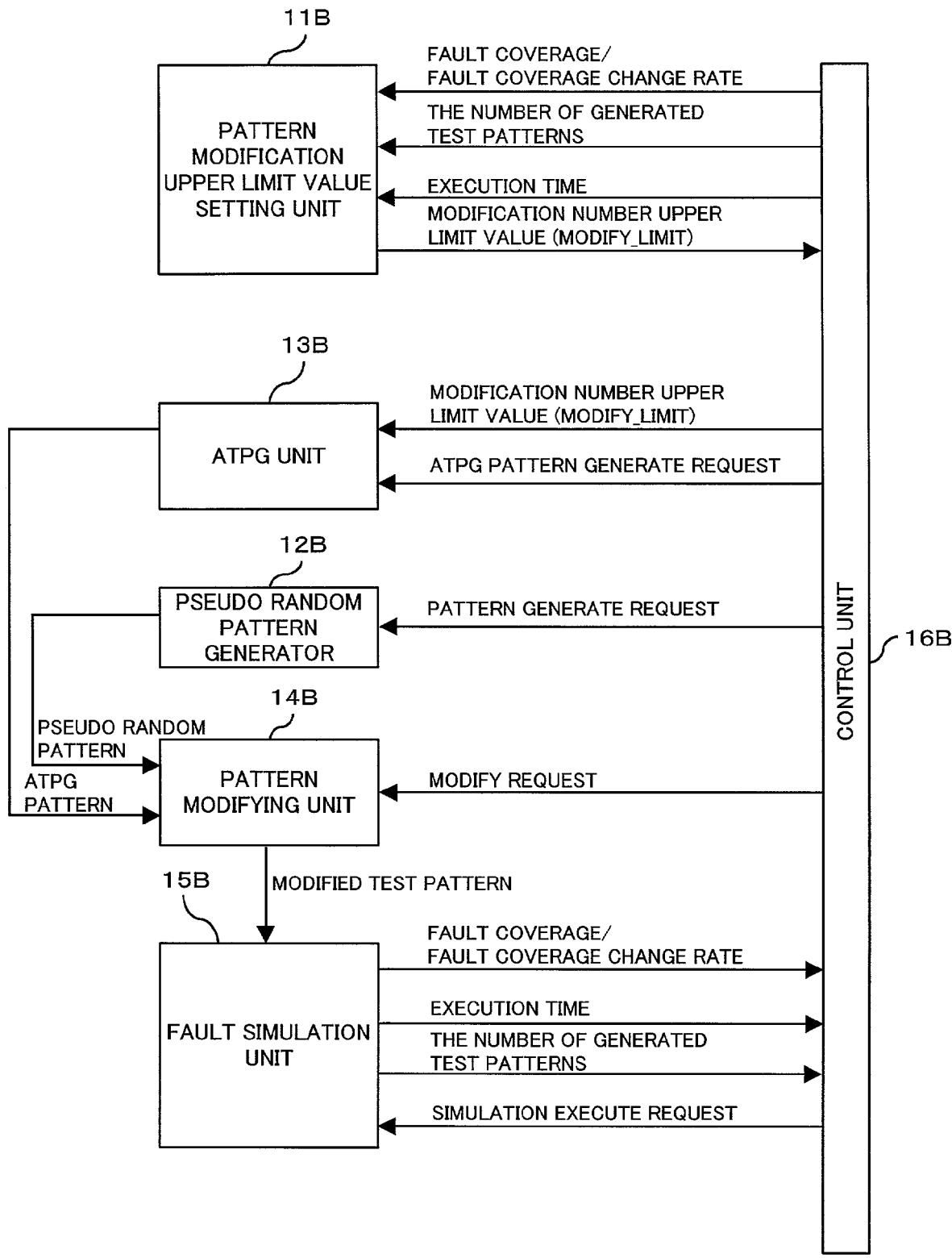
FIG. 19 is a block diagram showing a second example of structure of the testing apparatus for an integrated circuit according to the fifth embodiment of this invention.

FIG. 19 is a block diagram showing a second example of structure of the testing apparatus for an integrated circuit according to the fifth embodiment of this invention. As shown in FIG. 19, the testing apparatus in the second example of structure according to the fifth embodiment comprises a pattern modification upper limit value setting unit 11B, a pseudo random pattern generating unit 12B, an ATPG unit 13B, a pattern modifying unit 14B, a fault simulation unit 15B and a control unit 16B.

When the ATPG unit 13B executes a compressing process (dynamic compaction) on an ATPG pattern, the pattern modification upper limit value setting unit (execution limitation condition setting unit) 11B sets an execution limitation condition for the compressing process. Here, the pattern modification upper limit value setting unit 11B sets, as the execution limitation condition, an upper limit value of a quantity of pattern modification by the pattern modifying unit 14B when the patter modifying unit 14B to be described later modifies a pseudo random pattern on the basis of one ATPG pattern, such operating as to increase the upper limit value as generation of an ATPG pattern progresses.

Figure 20:
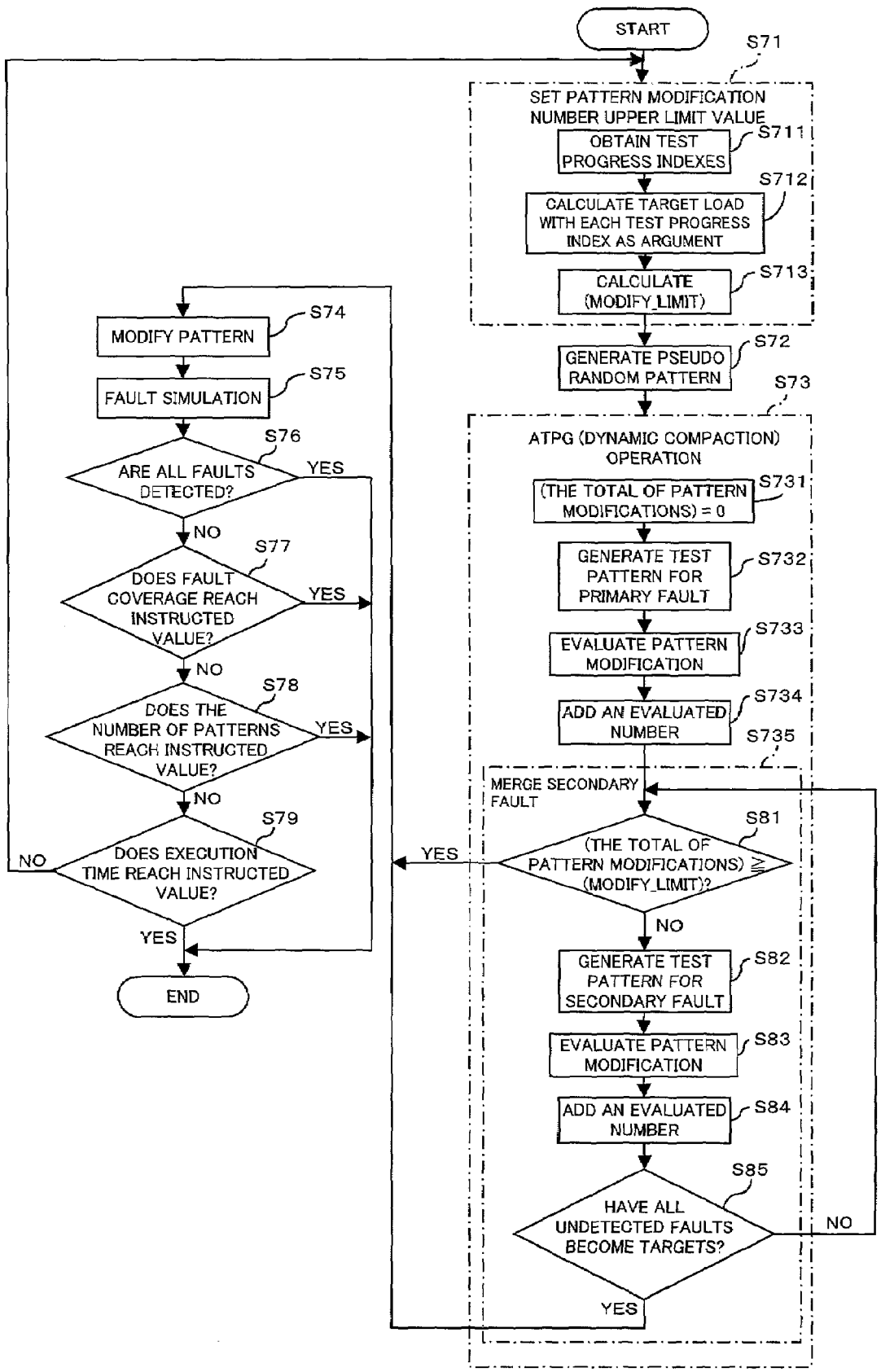
FIG. 20 is a flowchart for illustrating an operation of the second structural example shown in FIG. 18.
Figure 21:
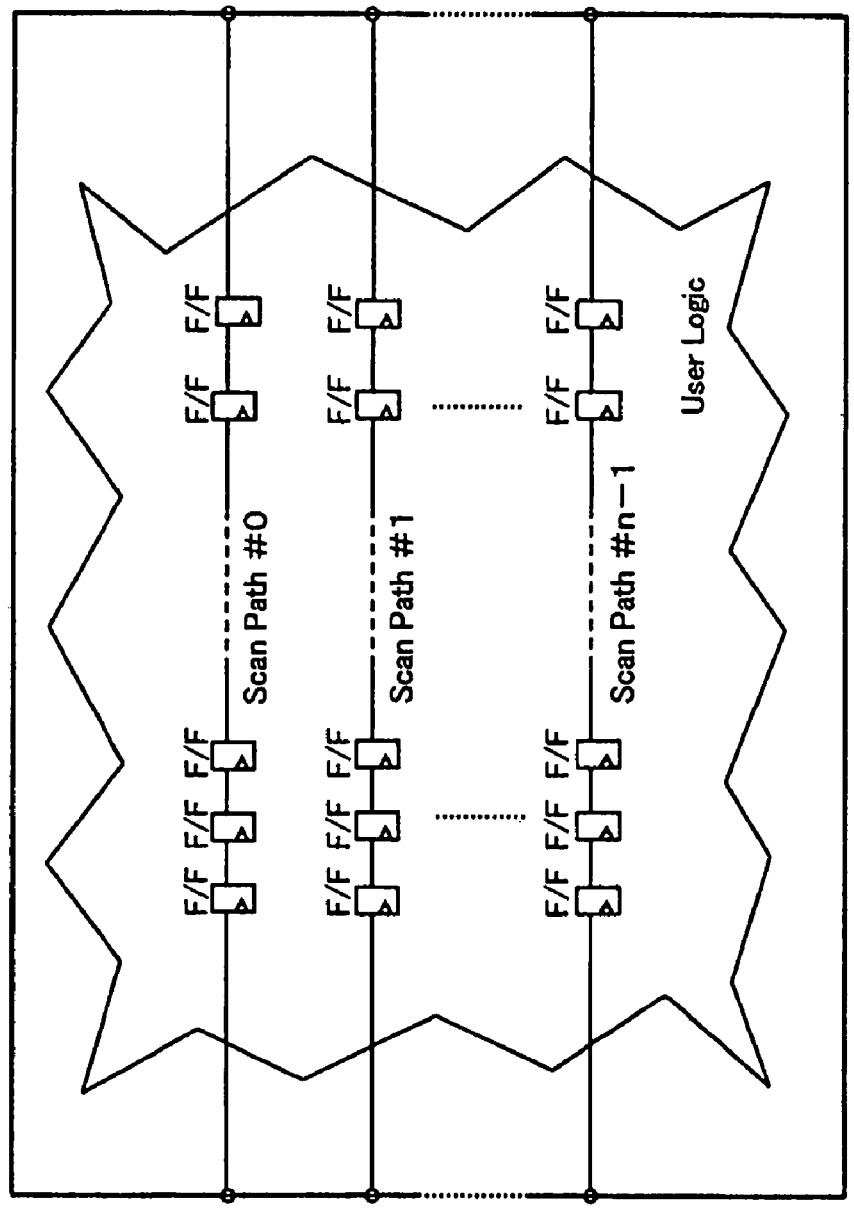
FIG. 21 is a diagram for illustrating a known scan design.
Figure 22:
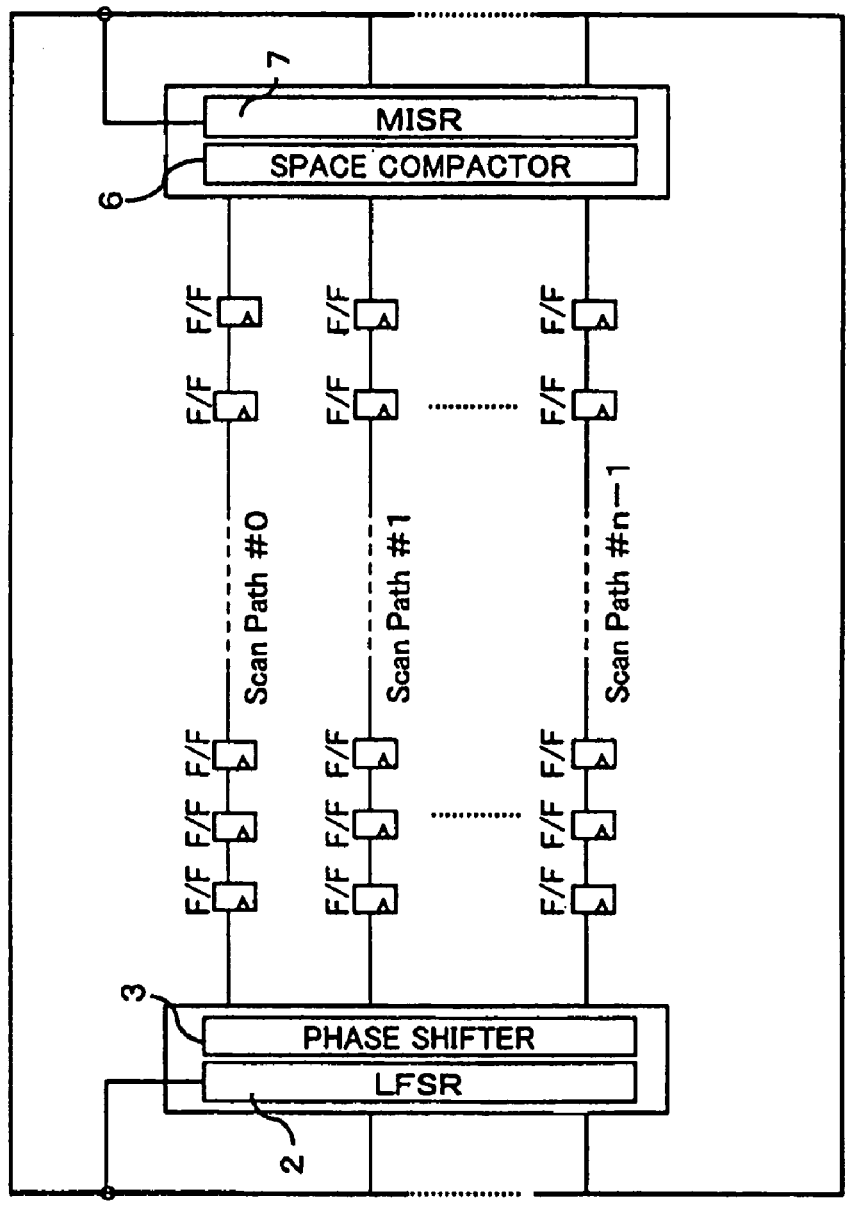
FIG. 22 is a diagram for illustrating a known BIST circuit.

More concretely, the pattern modification upper limit value setting unit 11B obtains a fault coverage, a change rate of the fault coverage, the number of generated test patterns, an execution time (execution time of the pseudo random pattern generating unit 12B) and the like as indexes representing progress of the test informed from the control unit 16B, calculates a modification number load (w_modify) as will be described later with reference to FIG. 20, calculates and sets a modification number upper limit value (modify_limit) that is upper limit (upper limit value of a pattern modification quantity) of the number of modified points on the basis of the modification number load and the number of scan F/Fs existing in a target circuit, and informs the control unit 16B of the modification number upper limit value.

The pseudo random pattern generating unit (pattern generator) 12B corresponds to the LFSR 2 according to the first embodiment, which generates a pseudo random pattern using a random number generator realized by an LFSR, as well.

The ATPG unit (automatic test pattern generating unit) 13B generates a test pattern in the dynamic compaction mode. The ATPG unit 13B compares a pseudo random pattern generated by the pseudo random pattern generating unit 12B with a test pattern (ATPG pattern) generated in the ATPG technique for primary fault or second fault, evaluates the number of pattern corrections estimated in the pattern modifying unit 14B to be described later one by one, and repeats test pattern generation (compressing process) for the secondary fault until a sum value (accumulated value) of the number of pattern corrections exceeds a correction number upper limit value (modify_limit) set by the pattern modification upper limit value setting unit 11B (that is, until the execution limitation condition is satisfied).

Namely, the ATPG unit 13B terminates the compressing process on an ATPG pattern when the pattern modification quantity, performed by the pattern modifying unit 14B in the case where the pattern modifying unit 14B modifies a pseudo random pattern on the basis of the ATPG pattern in which the detection target faults are compressed by the compaction, reaches a modification number upper limit value (modify$_{13}$ limit) set by the pattern modification upper limit value setting unit 11B.

The pattern modifying unit (pattern modifier) 14B corresponds to the pattern modifier 4 according to the first embodiment. The pattern modifying unit 14B receives an ATPG pattern generated by the ATPG unit 13B and a pseudo random pattern generated by the pseudo random pattern generating unit 12B, compares the ATPG pattern with the pseudo random pattern, inverts and modifies values of input points differing from values of the ATPG pattern in the pseudo random pattern, and transfers the modified pseudo random pattern as a modified test pattern to the fault simulation unit 15B.

The fault simulation unit 15B receives the test pattern modified by the pattern modifying unit 14B, simulates (evaluates) undetected faults that can be detected with the test pattern, and informs the control unit 16B of test progress indexes such as a fault coverage, a change rate of the fault coverage, an execution time, the number of generated test patterns and the like specified by the simulation.

The control unit 16B controls operations of the above pattern modification upper limit value setting unit 12B, the pseudo random pattern generating unit 12B, the ATPG unit 13B, the pattern modifying unit 14B and the fault simulation unit 15B. In concrete, the control unit 16B informs the pattern modification upper limit value setting unit 11B of test progress indexes, receives a modification number upper limit value, informs the ATPG unit 13B of the modification number upper limit value and an ATPG pattern generate request, informs the pseudo random pattern generating unit 12B of the pattern generate request, informs the pattern modifying unit 14B of a modify request, informs the fault simulation unit 15B of a simulation execute request, and receives the test progress indexes. The control unit 16B terminates the process when all faults are detected, or when any one of the fault coverage, the number of generated patterns and the execution time reaches an instructed value, like the control unit 16A.

Next description will be made of an operation of the testing apparatus configured as above according to a flowchart (steps S71 to S79) shown in FIG. 20 with reference to FIG. 19.

The pattern modification upper limit value setting unit 11B such calculates and sets a modification number upper limit value (modify_limit) that the modification number upper limit value is sufficiently small in the initial stage of test pattern generation and is increased as the test progresses, and informs the control unit 16B of it (step S71). At this time, the pattern modification upper limit value setting unit 11B obtains a fault coverage/fault coverage change rate, the number of generated test patterns, an execution time and the like as test progress indexes from the control unit 16B (step S711), and calculates a modification number load (w_modify) with these test progress indexes as arguments (step S712). An example of an equation for calculating a modification number load (w_modify) from a fault coverage is shown as the following equation (3):

$$(w\_modify)=(\text{fault coverage }(\%))/100.0 \qquad (3)$$

The pattern modification upper limit value setting unit 11B calculates and sets a modification number upper limit value (modify_limit) on the basis of a modification quantity load (w_modify) calculated using the above equation (3) and the number of scan F/Fs existing in a target circuit using, for example, the following equation (4), and informs the control unit 16B of it (step S713).

$$(\text{modify\_limit})=(\text{the number of scan F/Fs})^* (w\_modify) \qquad (4)$$

After that, the control unit 16B informs the pseudo random pattern generating unit 12B of a pattern generate request to make the pseudo random pattern generating unit 12B generate a pseudo random pattern (step S72), and informs the ATPG unit 13B of the modification number upper limit value (modify_limit) and an ATPG pattern generate request to makes the ATPG unit 13B execute ATPG pattern generation accompanied by dynamic compaction (step S73).

At this time, the ATPG unit 13B sets "0" as an initial value of a pattern modification total (step S731), generates a test pattern for primary fault (step S732), and evaluates the number of pattern modifications (step S733). At this time, the ATPG unit 13B compares the test pattern for primary fault with the pseudo random pattern, and evaluates and determines the number of pattern modifications estimated in the pattern modifying unit 14B. The ATPG unit 13B adds the number of pattern modifications evaluated to the total of pattern modifications (step S734), and merges the test pattern for detecting secondary fault (step S735).

This merging process is performed as follows at steps S81 to S85. First, it is determined whether the total of pattern modifications at present reaches the modification number upper limit value (modify_limit) or not (step S81). When the present pattern modification value does not reach the modification number upper limit value (NO route at step S81), a test pattern for secondary fault is generated and merged (step S82), and the number of pattern modifications is evaluated (step S83). At this time, the test pattern for secondary fault is compared with the pseudo random pattern in the similar manner at step S733, the number of pattern modifications estimated in the pattern modifying unit 14B is evaluated and determined. The number of pattern modifications is added to the total of pattern modifications (step S84), and it is determined whether all undetected faults have been targeted or not (step S85). When there remains any undetected fault (NO route at step S85), the procedure returns to step S81, and a process similar to the above is performed. When there remains no undetected fault (YES route at step S85), or when the total of pattern modifications reaches the upper limit value (YES route at step S81), the ATPG unit 13B terminates the dynamic compaction.

The control unit 16B informs the pattern modifying unit 14B of a modify request to makes the pattern modifying unit 14B execute a pseudo random pattern modifying process (step S74). At this time, the pattern modifying unit 14B compares the ATPG pattern generated by the ATPG unit 13B with the pseudo random pattern generated by the pseudo random pattern generating unit 12B, and inverts and modifies values of input points differing from values of the ATPG pattern. The pseudo random pattern modified as above is transmitted as a modified test pattern to the fault simulation unit 15B.

The control unit 16B informs the fault simulation unit 15B of a simulation execute request to make the fault simulation unit 15B execute simulation with the modified test pattern (step S75). At this time, the fault simulation unit 15B simulates (evaluates) undetected faults that can be detected with the modified test pattern, and informs the control unit 16B of test progress indexes such as a fault coverage/fault coverage change rate, an executing time, the number of generated test patterns and the like specified by the simulation.

After the simulation, the control unit 16B determines whether all the faults are detected or not (step S76), determines whether the fault coverage reaches an instructed value or not (step S77), determines whether the number of generated test patterns reaches an instructed value (limit value) or not (step S78), and determines whether the execution time reaches an instructed value (limit value) or not (step S79). When the determinations at step S76 to S79 all result in NO, the procedure returns to step S71, and a process similar to the above is performed. When any one of the determinations at step S76 to S79 results in YES, the process is terminated.

The testing apparatus in the second structural example of the fifth embodiment of this invention sets an upper limit value relating to the number of modifications (a quantity of modification at the time that a pseudo random pattern generated by the pseudo random pattern generating unit 12B is modified on the basis of an ATPG pattern generated by the ATPG unit 13B) in the pattern modifying unit 14B when the ATPG unit 13B compresses detection target faults in the dynamic compaction, and terminates the compaction when the number of modifications reaches the upper limit value, the upper limit value being such set as to be smaller in the initial stage of test pattern generation, while being increased as the test pattern generation progresses. Similar to the first structural example described above, it is possible to suppress the number of request values (values other than indeterminate values) in an ATPG pattern. In particular, a quantity of test pattern modification in the initial stage of test pattern generation is suppressed. Accordingly, it is possible to decrease a quantity of pattern modification by the pattern modifying unit 14B, and allow efficient pattern modification, and an efficient test on an integrated circuit.

[8] Others

Note that the present invention is not limited to the above embodiments, may be modified in various ways without departing from the scope of the invention.

What is claimed is:

1. A testing apparatus for an integrated circuit comprising:
   a pattern generator built in said integrated circuit to generate pseudo random patterns as test patterns;
   a plurality of shift registers configured with sequential circuit elements inside said integrated circuit;
   an automatic test pattern generating unit to generate ATPG patterns; and
   a pattern modifier to modify a portion, to which a predetermined value is required to be set in order to detect a fault, in said pseudo random patterns generated by said pattern generator, on a basis of said ATPG patterns, by interpolating said pseudo random patterns with said ATPG patterns, and to input said modified pseudo random patterns to said shift registers.

2. The testing apparatus according to claim 1, wherein said pattern modifier selects a suitable combination of one pseudo random pattern and one ATPG pattern from said pseudo random patterns generated by said pattern generator and said ATPG patterns, and modifies said selected pseudo random pattern on the basis of said selected ATPG pattern.

3. The testing apparatus according to claim 1, wherein said automatic test pattern generating unit refers to each of said pseudo random patterns generated by said pattern generator, selects a suitable target fault according to each of said pseudo random patterns, and generates an ATPG pattern, with which said target fault can be detected, as a reference for modifying each of said pseudo random patterns.

4. The testing apparatus according to claim 1 further comprising:
   a characteristic information determining unit to compare said pseudo random patterns generated by said pattern generator with said ATPG patterns to determine characteristic information on said pattern generator with which said pattern generator can generate pseudo random patterns analogous to said ATPG patterns;
   wherein said pattern generator generates said pseudo random patterns on the basis of said characteristic information determined by said characteristic information determining unit.

5. The testing apparatus according to claim 4, wherein said characteristic information is a seed value to be set to said pattern generator.

6. The testing apparatus according to claim 4, wherein said pattern generator is configured as a linear feedback shift register, and said characteristic information is a feedback position in said linear feedback shift register.

7. The testing apparatus according to claim 1 further comprising an execution limitation condition setting unit for setting, when said automatic test pattern generating unit executes a compressing process on said ATPG pattern, an execution limitation condition for limiting the execution of said compressing process;
   wherein said automatic test pattern generating unit terminates said compressing process on said ATPG pattern when said execution limitation condition set by said execution limitation condition setting unit is satisfied.

8. The testing apparatus according to claim 7, wherein said execution limitation condition setting unit sets, as said execution limitation condition, an upper limit value of the number of faults to be detected with one ATPG pattern, and said automatic test pattern generating unit terminates said compressing process on said ATPG pattern when the number of detection target faults, that are compressed in said ATPG pattern by said compressing process, reaches said upper limit value.

9. The testing apparatus according to claim 8, wherein said execution limitation condition setting unit increases said upper limit value as generation of said ATPG pattern progresses.

10. The testing apparatus according to claim 7, wherein said execution limitation condition setting unit sets, as said execution limitation condition, an upper value of a quantity of pattern modification by said pattern modifier in the case where said pattern modifier modifies one of said pseudo random patterns on the basis of one ATPG pattern, and said automatic test pattern generating unit terminates said compressing process on said ATPG pattern when a quantity of pattern modification, performed by said pattern modifier in the case where said pattern modifier modifies said pseudo random pattern on the basis of one ATPG pattern in which detection target faults are compressed by said compressing process, reaches said upper limit value.

11. The testing apparatus according to claim 10, wherein said execution limitation condition setting unit increases said upper limit value as generation of said ATPG pattern progresses.

12. A testing apparatus for an integrated circuit comprising:
a pattern generator built in said integrated circuit to generate pseudo random patterns as test patterns;
a plurality of shift registers configured with sequential circuit elements inside said integrated circuit;
an automatic test pattern generating unit to generate ATPG patterns;
a pattern modifier to modify a portion, to which a predetermined value is required to be set in order to detect a fault, in said pseudo random patterns generated by said pattern generator, on a basis of said ATPG patterns, by interpolating said pseudo random patterns with said ATPG patterns, and to input said modified pseudo random patterns to said shift registers;
a mask to convert an indeterminate value in outputs from said shift registers into a state value of "0" or "1" to mask said indeterminate value; and an output verifier to verify output results in which said indeterminate value is masked by said mask, said output results not containing said indeterminate value.

13. The testing apparatus according to claim 12, wherein said output verifier includes a compressing means for compressing said masked output results.

14. The testing apparatus according to claim 12, wherein said pattern modifier selects a suitable combination of one pseudo random pattern and one ATPG pattern from said pseudo random patterns generated by said pattern generator and said ATPG patterns, and modifies said selected pseudo random pattern on the basis of said selected ATPG pattern.

15. The testing apparatus according to claim 12, wherein said automatic test pattern generating unit refers to each of said pseudo random patterns generated by said pattern generator, selects a suitable target fault according to each of said pseudo random patterns, and generates an ATPG pattern, with which said target fault can be detected, as a reference for modifying each of said pseudo random patterns.

16. The testing apparatus according to claim 12 further comprising:
a characteristic information determining unit to compare said pseudo random patterns generated by said pattern generator with said ATPG patterns to determine characteristic information on said pattern generator with which said pattern generator can generate pseudo random patterns analogous to said ATPG patterns;
wherein said pattern generator generates said pseudo random patterns on the basis of said characteristic information determined by said characteristic information determining unit.

17. The testing apparatus according to claim 16, wherein said characteristic information is a seed value to be set to said pattern generator.

18. The testing apparatus according to claim 16, wherein said pattern generator is configured as a linear feedback shift register, and said characteristic information is a feedback position in said linear feedback shift register.

19. The testing apparatus according to claim 12 further comprising an execution limitation condition setting unit for setting, when said automatic test pattern generating unit executes a compressing process on said ATPG pattern, an execution limitation condition for limiting the execution of said compressing process;
wherein said automatic test pattern generating unit terminates said compressing process on said ATPG pattern when said execution limitation condition set by said execution limitation condition setting unit is satisfied.

20. The testing apparatus according to claim 19, wherein said execution limitation condition setting unit sets, as said execution limitation condition, an upper limit value of the number of faults to be detected with one ATPG pattern, and said automatic test pattern generating unit terminates said compressing process on said ATPG pattern when the number of detection target faults, that are compressed in said ATPG pattern by said compressing process, reaches said upper limit value.

21. The testing apparatus according to claim 20, wherein said execution limitation condition setting unit increases said upper limit value as generation of said ATPG pattern progresses.

22. The testing apparatus according to claim 19, wherein said execution limitation condition setting unit sets, as said execution limitation condition, an upper value of a quantity of pattern modification by said pattern modifier in the case where said pattern modifier modifies one of said pseudo random patterns on the basis of one ATPG pattern, and said automatic test pattern generating unit terminates said compressing process on said ATPG pattern when a quantity of pattern modification, performed by said pattern modifier in the case where said pattern modifier modifies said pseudo random pattern on the basis of one ATPG pattern in which detection target faults are compressed by said compressing process, reaches said upper limit value.

23. The testing apparatus according to claim 22, wherein said execution limitation condition setting unit increases said upper limit value as generation of said ATPG pattern progresses.

24. A testing method for an integrated circuit comprising:
generating pseudo random patterns as test patterns by a pattern generator built in said integrated circuit;
generating ATPG patterns;
modifying a portion, to which a predetermined value is required to be set in order to detect a fault, in said generated pseudo random patterns on a basis of said ATPG patterns, by interpolating said pseudo random patterns with said ATPG patterns; and
inputting said modified pseudo random patterns to a plurality of shift registers configured with sequential circuit elements inside said integrated circuit.

25. An integrated circuit including sequential circuit elements having:
a plurality of shift registers configured with said sequential circuit elements;
a pattern generator to generate pseudo random patterns as test patterns;
an automatic test pattern generating unit to generate ATPG patterns; and a pattern modifier to modify a portion, to which a predetermined value is required to be set in order to detect a fault, in said pseudo random patterns generated by said pattern generator, on a basis of said ATPG patterns given from said automatic test pattern generating unit, by interpolating said pseudo random patterns with said ATPG patterns, and to input said modified pseudo random patterns to said shift registers.

26. An integrated circuit including sequential circuit elements having:
   a plurality of shift registers configured with said sequential circuit elements;
   a pattern generator to generate pseudo random patterns as test patterns;
   an automatic test pattern generating unit to generate ATPG patterns;
   a pattern modifier to modify a portion, to which a predetermined value is required to be set in order to detect a fault, in said pseudo random pattern generated by said pattern generator, on a basis of said ATPG patterns given from said automatic test pattern generating unit, by interpolating said pseudo random pattern with said ATPG patterns, and to input said modified pseudo random patterns to said shift registers;
   a mask to convert an indeterminate value in outputs from said shift registers into a state value of "0" or "1" to mask said indeterminate value; and
   an output verifier to verify output results in which said indeterminate value is masked by said mask, said output results not containing said indeterminate value.

* * * * *